US012164009B2

(12) United States Patent
Takasugi et al.

(10) Patent No.: US 12,164,009 B2
(45) Date of Patent: Dec. 10, 2024

(54) SENSOR INCLUDING A PLURALITY OF INSULATING LAYERS MADE OF DIFFERENT INSULATING MATERIALS

(71) Applicant: TDK CORPORATION, Tokyo (JP)

(72) Inventors: Keisuke Takasugi, Tokyo (JP); Kenzo Makino, Tokyo (JP); Hiraku Hirabayashi, Tokyo (JP); Masanori Sakai, Tokyo (JP)

(73) Assignee: TDK CORPORATION, Tokyo (JP)

( * ) Notice: Subject to any disclaimer, the term of this patent is extended or adjusted under 35 U.S.C. 154(b) by 202 days.

(21) Appl. No.: 17/895,775

(22) Filed: Aug. 25, 2022

(65) Prior Publication Data

US 2023/0089204 A1 Mar. 23, 2023

Related U.S. Application Data

(60) Provisional application No. 63/246,427, filed on Sep. 21, 2021.

(30) Foreign Application Priority Data

Aug. 9, 2022 (JP) .................................. 2022-126969

(51) Int. Cl.
*G01R 33/09* (2006.01)
*G01R 15/14* (2006.01)
*H10N 50/80* (2023.01)

(52) U.S. Cl.
CPC ......... *G01R 33/093* (2013.01); *G01R 15/148* (2013.01); *H10N 50/80* (2023.02)

(58) Field of Classification Search
CPC .............................. G01R 33/093; G01R 15/148
See application file for complete search history.

(56) References Cited

U.S. PATENT DOCUMENTS

| 7,687,284 | B2 | 3/2010 | Naito et al. | |
|---|---|---|---|---|
| 2008/0169807 | A1* | 7/2008 | Naito | G01R 33/093 |
| | | | | 257/E27.005 |
| 2009/0015285 | A1* | 1/2009 | Farooq | G01R 31/2853 |
| | | | | 257/E23.001 |
| 2009/0102055 | A1* | 4/2009 | Aoki | H10B 41/49 |
| | | | | 257/773 |
| 2013/0088318 | A1* | 4/2013 | Inaba | H01F 27/36 |
| | | | | 29/606 |
| 2018/0041187 | A1* | 2/2018 | Yashiro | H03H 9/02574 |
| 2021/0156933 | A1 | 5/2021 | Makino et al. | |

FOREIGN PATENT DOCUMENTS

WO 2016/021260 A1 2/2016

* cited by examiner

*Primary Examiner* — Alesa Allgood
(74) *Attorney, Agent, or Firm* — Oliff PLC

(57) ABSTRACT

A magnetic sensor includes a first insulating layer, a second insulating layer, a third insulating layer, a lower coil element located on an opposite side of the first insulating layer from the second insulating layer, and a second MR element. The second MR element includes a magnetization pinned layer and a free layer. The magnetization pinned layer and the free layer are located on an opposite side of the third insulating layer from the second insulating layer. The first and third insulating layers each contain a first insulating material. The second insulating layer contains a second insulating material.

17 Claims, 13 Drawing Sheets

SENSOR INCLUDING A PLURALITY OF INSULATING LAYERS MADE OF DIFFERENT INSULATING MATERIALS

CROSS REFERENCE TO RELATED APPLICATIONS

This application claims the benefit of U.S. Provisional Patent Application No. 63/246,437 filed on Sep. 21, 2021 and Japanese Priority Patent Application No. 2022-126969 filed on Aug. 9, 2022, the entire contents of each of which are incorporated herein by their reference.

BACKGROUND

The technology relates to a sensor including an insulating layer interposed between a metal layer and a sensor element.

Magnetic sensors using magnetoresistive elements have been used for various applications in recent years. A system including a magnetic sensor may be intended to detect a magnetic field containing a component in a direction perpendicular to the surface of a substrate by using a magnetoresistive element provided on the substrate. In such a case, the magnetic field containing the component in the direction perpendicular to the surface of the substrate can be detected by providing a soft magnetic body for converting a magnetic field in the direction perpendicular to the surface of the substrate into a magnetic field in the direction parallel to the surface of the substrate or locating the magnetoresistive element on an inclined surface formed on the substrate.

U.S. Pat. No. 7,687,284 B2 discloses a magnetic sensor including an X-axis sensor, a Y-axis sensor, and a Z-axis sensor disposed on a substrate. Magnetoresistive elements constituting the Z-axis sensor are disposed on inclined surfaces of protrusions formed on an underlying film of the substrate.

The magnetic sensor disclosed in U.S. Pat. No. 7,687,284 B2 includes a wiring layer and the like disposed in advance on the substrate. The underlying film includes a plurality of insulating films formed on the wiring layer. If an insulating layer is formed on a metal layer to form a support member for magnetoresistive elements, like the underlying film disclosed in U.S. Pat. No. 7,687,284 B2, the support member can crack in the process of manufacturing the magnetic sensor.

The foregoing problem can also occur even if the support member does not have a protrusion, as long as the condition that an insulating layer is formed on a metal layer is satisfied. The foregoing problem is not limited to magnetic sensors, and applies to sensors in general where a sensor element is disposed on a support member satisfying the foregoing condition.

SUMMARY

A sensor according to one embodiment of the technology is a sensor configured to detect a predetermined physical quantity. The sensor includes a first insulating layer, a second insulating layer, and a third insulating layer arranged in order along a first direction, a metal layer located on an opposite side of the first insulating layer from the second insulating layer, and a sensor element configured to change in a physical property depending on the predetermined physical quantity. The sensor element includes a functional layer constituting at least a part of the sensor element. The functional layer is located on an opposite side of the third insulating layer from the second insulating layer. The first and third insulating layers each contain a first insulating material. The second insulating layer contains a second insulating material.

In the sensor according to one embodiment of the technology, the first and third insulating layers each contain the first insulating material. The second insulating layer contains the second insulating material. According to one embodiment of the technology, the sensor including the insulating layers between the metal layer and the sensor element can thereby be prevented from causing a crack in the insulating layers.

Other and further objects, features and advantages of the technology will appear more fully from the following description.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
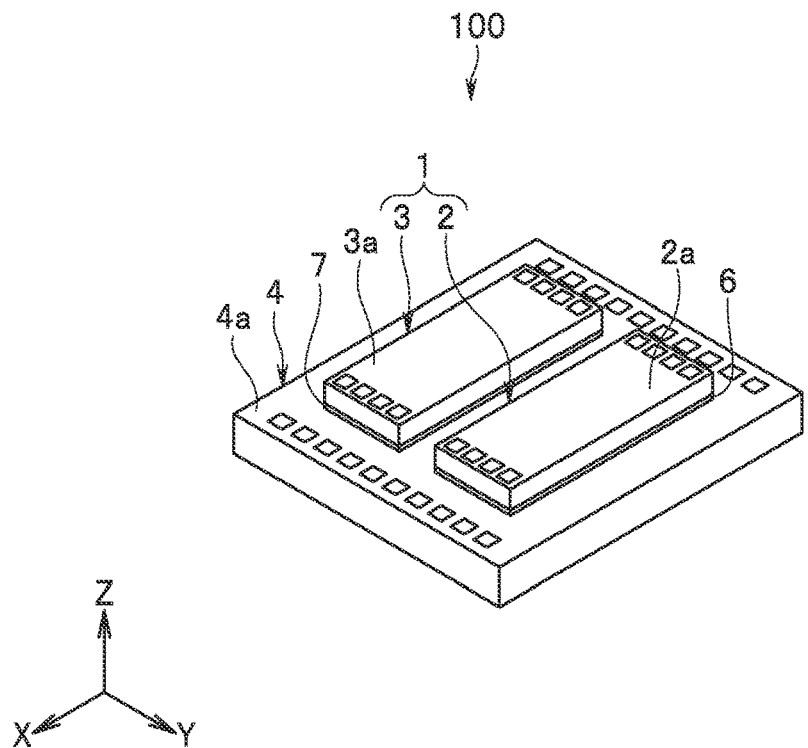
FIG. 1 is a perspective view showing a magnetic sensor device including a magnetic sensor according to a first example embodiment of the technology.

An object of the technology is to provide a sensor including an insulating layer interposed between a metal layer and a sensor element, wherein the insulating layer is prevented from cracking.

In the following, some example embodiments and modification examples of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. Note that the description is given in the following order.

The plurality of example embodiments of the technology to be described below relate to a sensor configured to detect a predetermined physical quantity. In the plurality of example embodiments, the sensor includes a sensor element configured to change in physical properties depending on the predetermined physical quantity. For example, the predetermined physical quantity may be at least either a direction or a strength of a target magnetic field that is a magnetic field to be detected. In such a case, the sensor element may be a magnetic detection element configured to detect a change in at least either the direction or the strength of the target magnetic field. The sensor including the magnetic detection element is also referred to as a magnetic sensor. The magnetic sensor is configured to detect at least either the direction or the strength of the target magnetic field. The plurality of example embodiments will be described in detail below by using a case where the sensor is a magnetic sensor as an example.

First Example Embodiment

Figure 2:
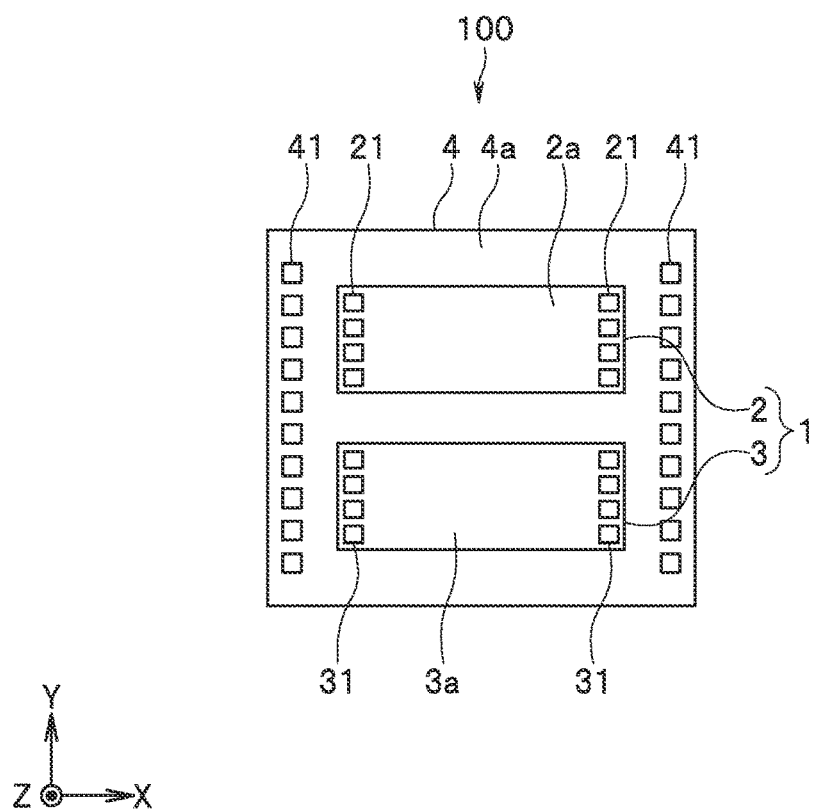
FIG. 2 is a plan view showing the magnetic sensor device shown in FIG. 1.
Figure 3:
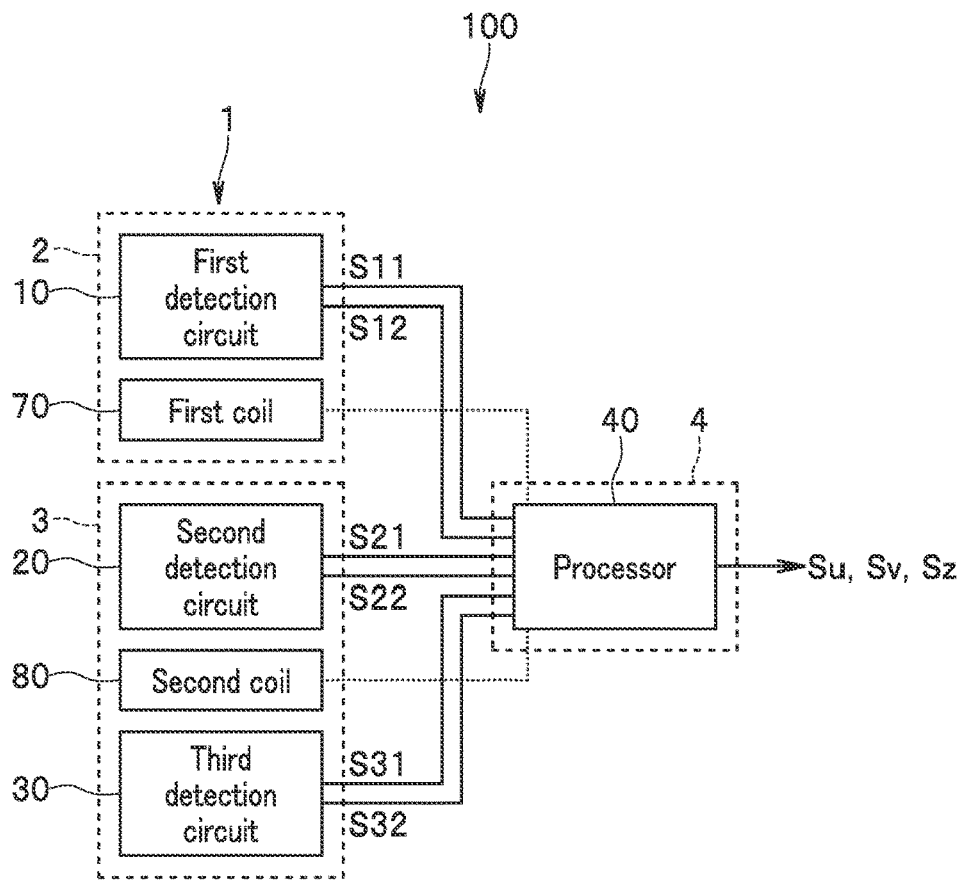
FIG. 3 is a functional block diagram showing a configuration of the magnetic sensor device shown in FIG. 1.

A configuration of a magnetic sensor device including a magnetic sensor according to a first example embodiment of the technology will initially be described with reference to FIGS. 1 to 3. FIG. 1 is a perspective view showing a magnetic sensor device 100. FIG. 2 is a plan view showing the magnetic sensor device 100. FIG. 3 is a functional block diagram showing a configuration of the magnetic sensor device 100.

The magnetic sensor device 100 includes a magnetic sensor 1. The magnetic sensor 1 corresponds to the "sensor" of the technology.

The magnetic sensor 1 includes a first chip 2 and a second chip 3. The magnetic sensor device 100 further includes a support 4 that supports the first chip 2 and the second chip 3. The first chip 2, the second chip 3, and the support 4 each have a rectangular solid shape. The support 4 has a reference plane 4a that is a top surface, a bottom surface located opposite to the reference plane 4a, and four side surfaces connecting the reference plane 4a and the bottom surface.

Now, a description will be given of a reference coordinate system in the present example embodiment with reference to FIGS. 1 and 2. The reference coordinate system is an orthogonal coordinate system that is set with reference to a magnetic sensor device 100 and defined by three axes. An X direction, a Y direction, and a Z direction are defined in the reference coordinate system. The X, Y, and Z directions are orthogonal to each other. In particular, in the example embodiment, a direction that is perpendicular to the reference plane 4a of the support 4 and directed from the bottom surface of the support 4 to the reference plane 4a is referred to as the Z direction. The opposite directions to the X, Y, and Z directions will be expressed as −X, −Y, and −Z directions, respectively. The three axes defining the reference coordinate system are an axis parallel to the X direction, an axis parallel to the Y direction, and an axis parallel to the Z direction.

Hereinafter, the term "above" refers to positions located forward of a reference position in the Z direction, and "below" refers to positions opposite from the "above" positions with respect to the reference position. For each component of the magnetic sensor device 100, the term "top surface" refers to a surface of the component lying at the end thereof in the Z direction, and "bottom surface" refers to a surface of the component lying at the end thereof in the −Z direction. The expression "when seen in the Z direction" means that an intended object is seen from a position at a distance in the Z direction.

The first chip 2 has a top surface 2a and a bottom surface that are positioned opposite to each other, and four side surfaces connecting the top surface 2a and the bottom surface. The second chip 3 has a top surface 3a and a bottom surface positioned opposite to each other, and four side surfaces connecting the top surface 3a and the bottom surface.

The first chip 2 is mounted on the reference plane 4a in a posture such that the bottom surface of the first chip 2 faces the reference plane 4a of the support 4. The second chip 3 is mounted on the reference plane 4a in a posture such that the bottom surface of the second chip 3 faces the reference plane 4a of the support 4. The first chip 2 and the second chip 3 are bonded to the support 4 with, for example, adhesives 6 and 7, respectively.

The first chip 2 has a plurality of first electrode pads 21 disposed on the top surface 2a. The second chip 3 has a plurality of second electrode pads 31 disposed on the top surface 3a. The support 4 has a plurality of third electrode pads 41 disposed on the reference plane 4a. Although not shown, in the magnetic sensor device 100, among the plurality of first electrode pads 21, the plurality of second electrode pads 31, and the plurality of third electrode pads 41, corresponding pairs are connected with bonding wires.

A dimension in a direction perpendicular to the reference plane 4a is referred to as thickness. As shown in FIG. 1, the thickness of the first chip 2 and the thickness of the second chip 3 are the same. The thickness of the support 4 is greater than the thickness of the first chip 2 and the thickness of the second chip 3.

The magnetic sensor 1 includes a first detection circuit 10, a second detection circuit 20, and a third detection circuit 30. The first chip 2 includes the first detection circuit 10. The second chip 3 includes the second and third detection circuits 20 and 30.

The magnetic sensor device 100 further includes a processor 40. The support 4 includes the processor 40. The first to third detection circuits 10, 20, and 30 and the processor 40 are connected via a plurality of first electrode pads 21, a plurality of second electrode pads 31, a plurality of third electrode pads 41, and a plurality of bonding wires.

The first to third detection circuits 10, 20, and 30 each include a plurality of magnetic detection elements, and are configured to detect a target magnetic field and generate at least one detection signal. In particular, in the example embodiment, the plurality of magnetic detection elements are a plurality of magnetoresistive elements. The magnetoresistive elements will hereinafter be referred to as MR elements.

The processor 40 is configured to generate a first detection value, a second detection value, and a third detection value by processing the plurality of detection signals generated by the first to third detection circuits 10, 20, and 30. The first, second, and third detection values have a correspondence with components of the magnetic field in three respective different directions at a predetermined reference position. In particular, in the present example embodiment, the foregoing three different directions are two directions parallel to an XY plane and a direction parallel to the Z direction. For example, the processor 40 is constructed of an application-specific integrated circuit (ASIC).

Figure 4:
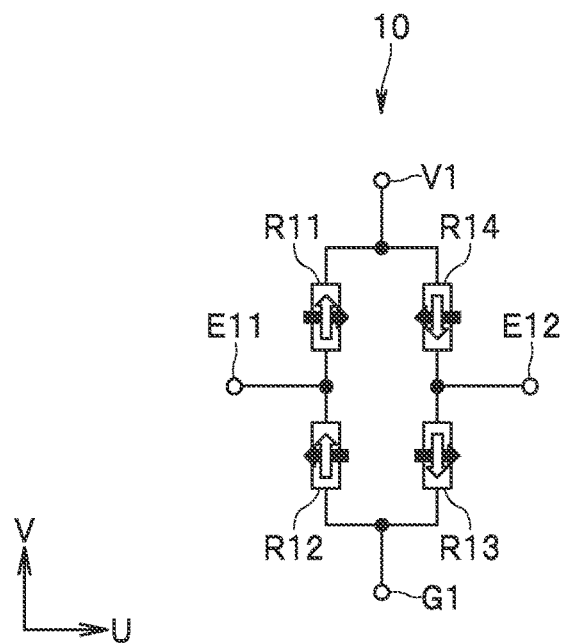
FIG. 4 is a circuit diagram showing a circuit configuration of a first detection circuit of the first example embodiment of the technology.
Figure 5:
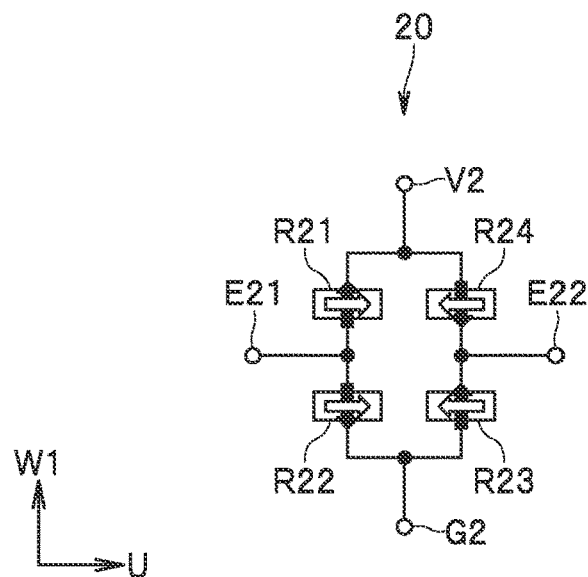
FIG. 5 is a circuit diagram showing a circuit configuration of a second detection circuit of the first example embodiment of the technology.
Figure 6:
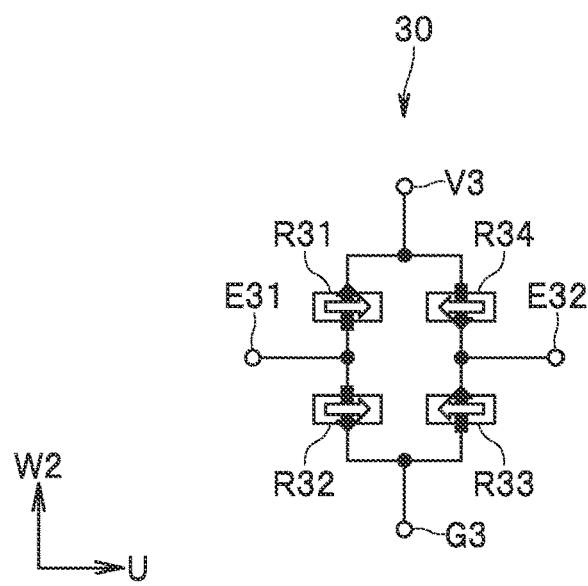
FIG. 6 is a circuit diagram showing a circuit configuration of a third detection circuit of the first example embodiment of the technology.
Figure 7:
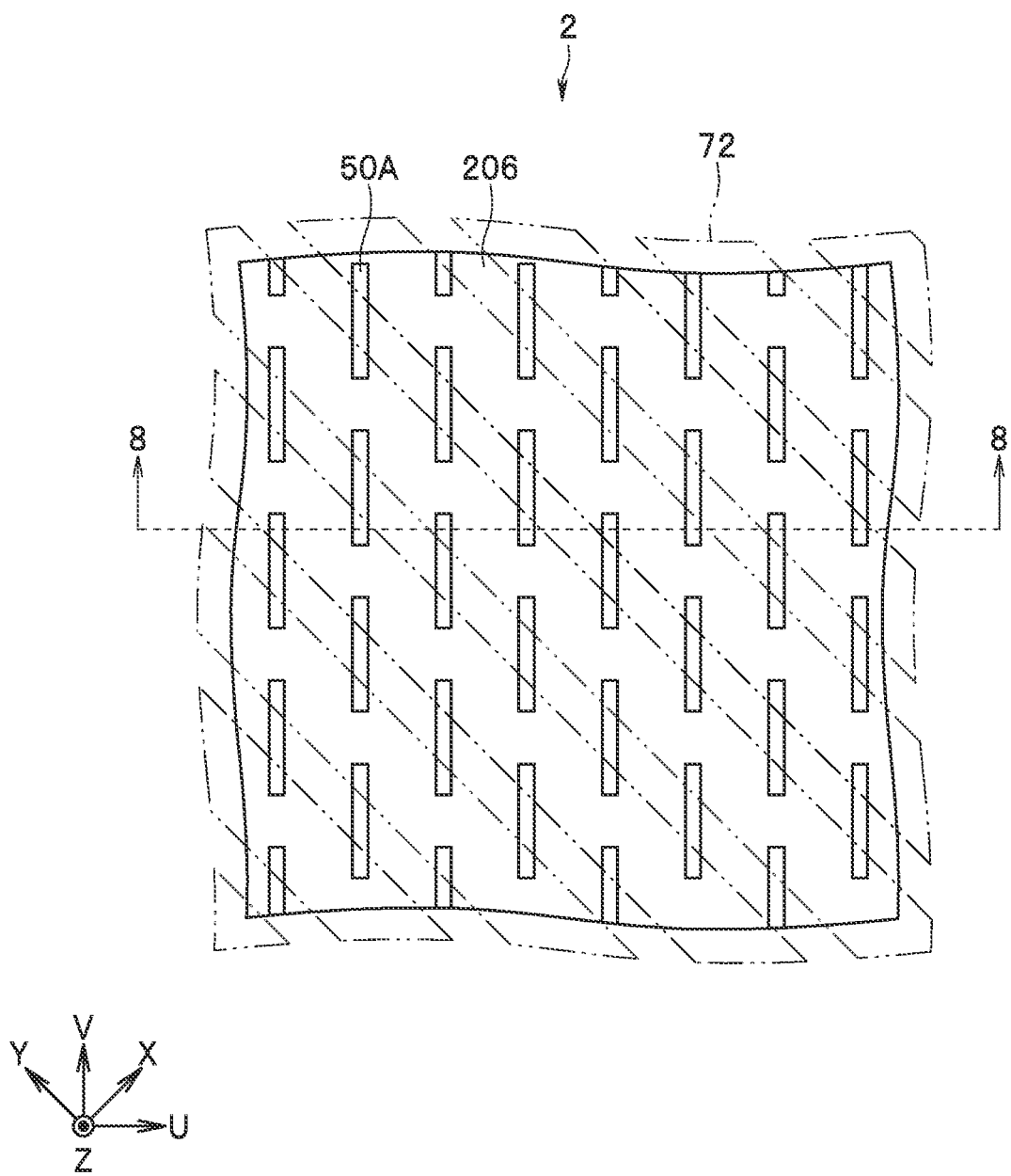
FIG. 7 is a plan view showing a part of a first chip of the first example embodiment of the technology.
Figure 8:
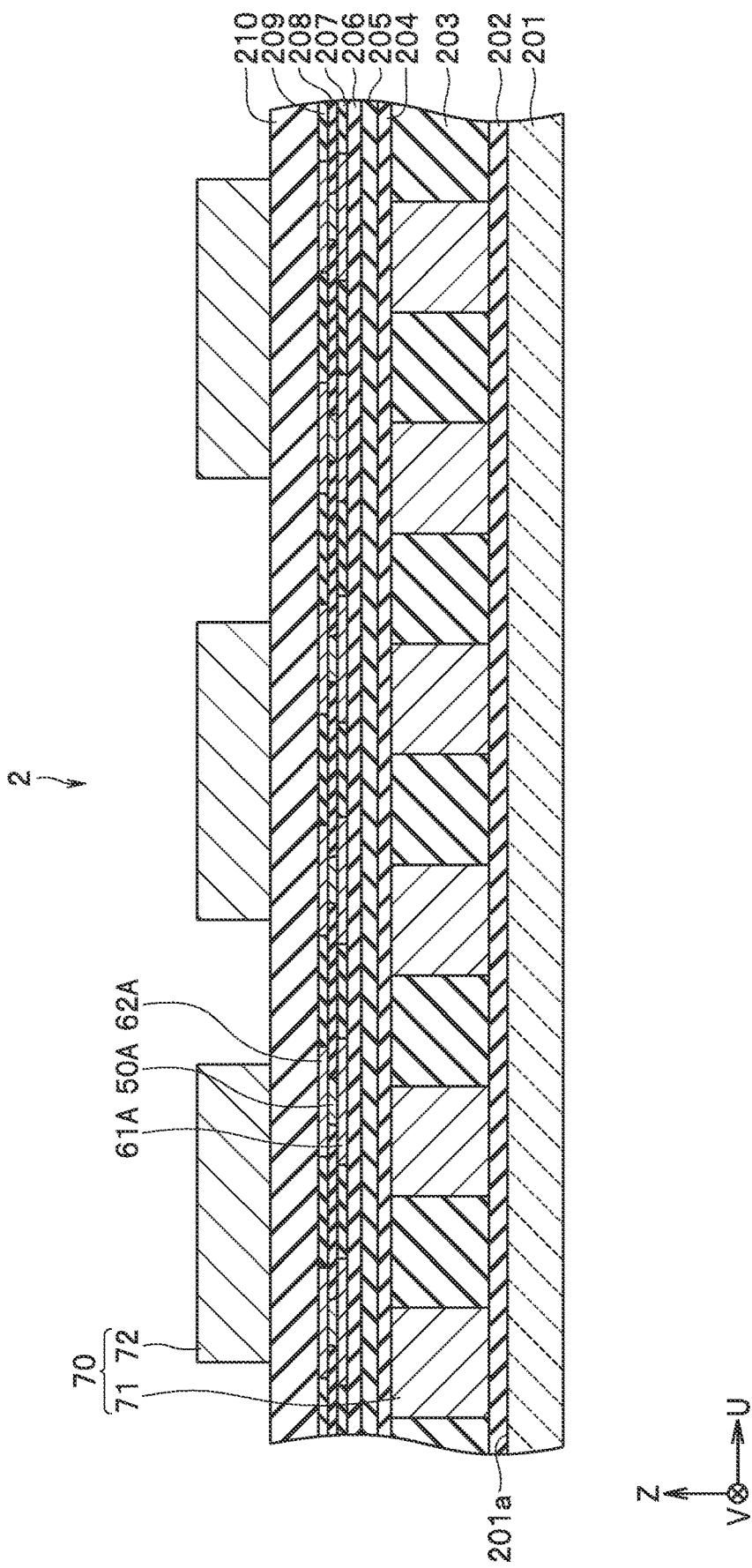
FIG. 8 is a sectional view showing a part of the first chip of the first example embodiment of the technology.
Figure 9:
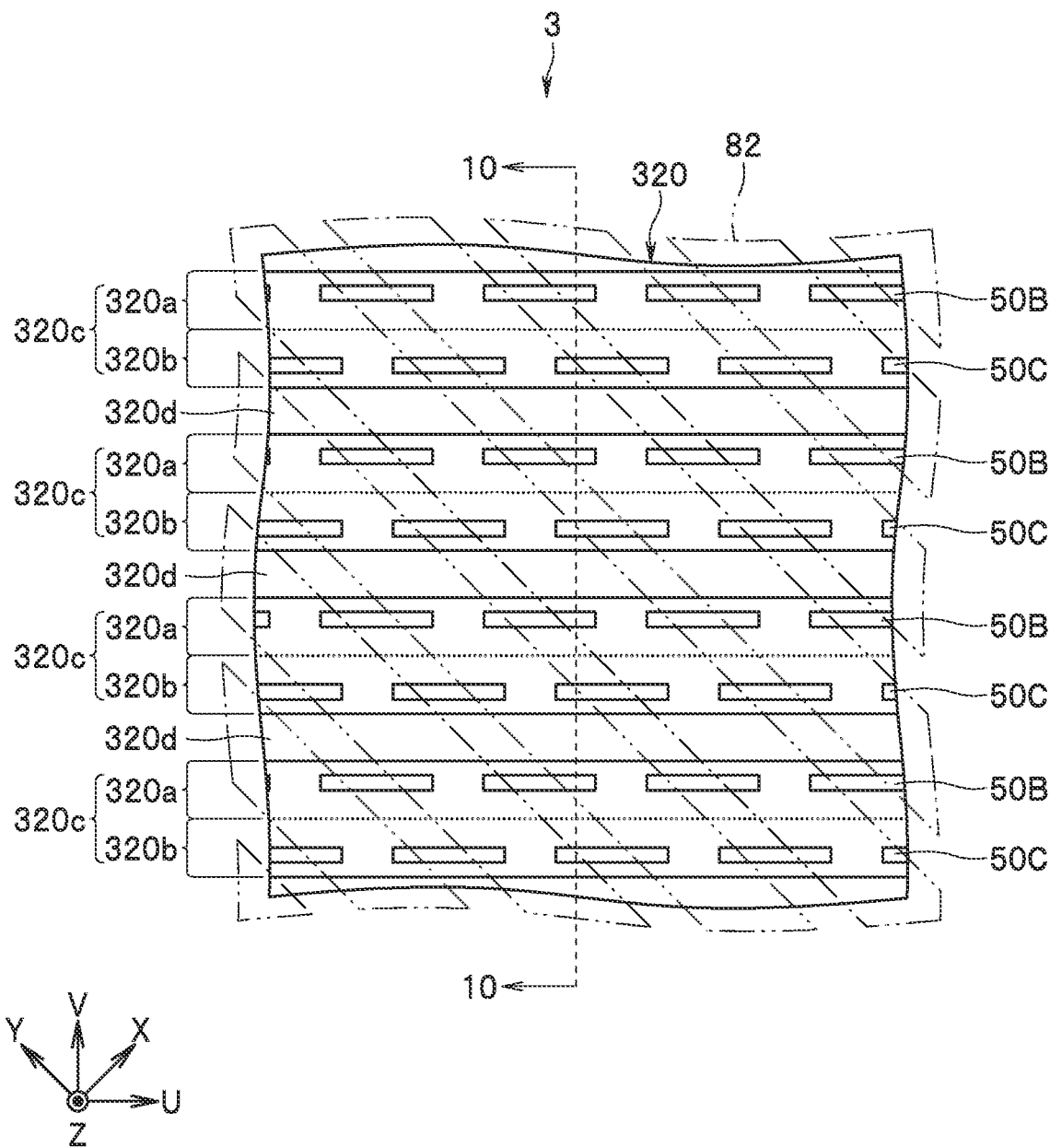
FIG. 9 is a plan view showing a part of a second chip of the first example embodiment of the technology.
Figure 10:
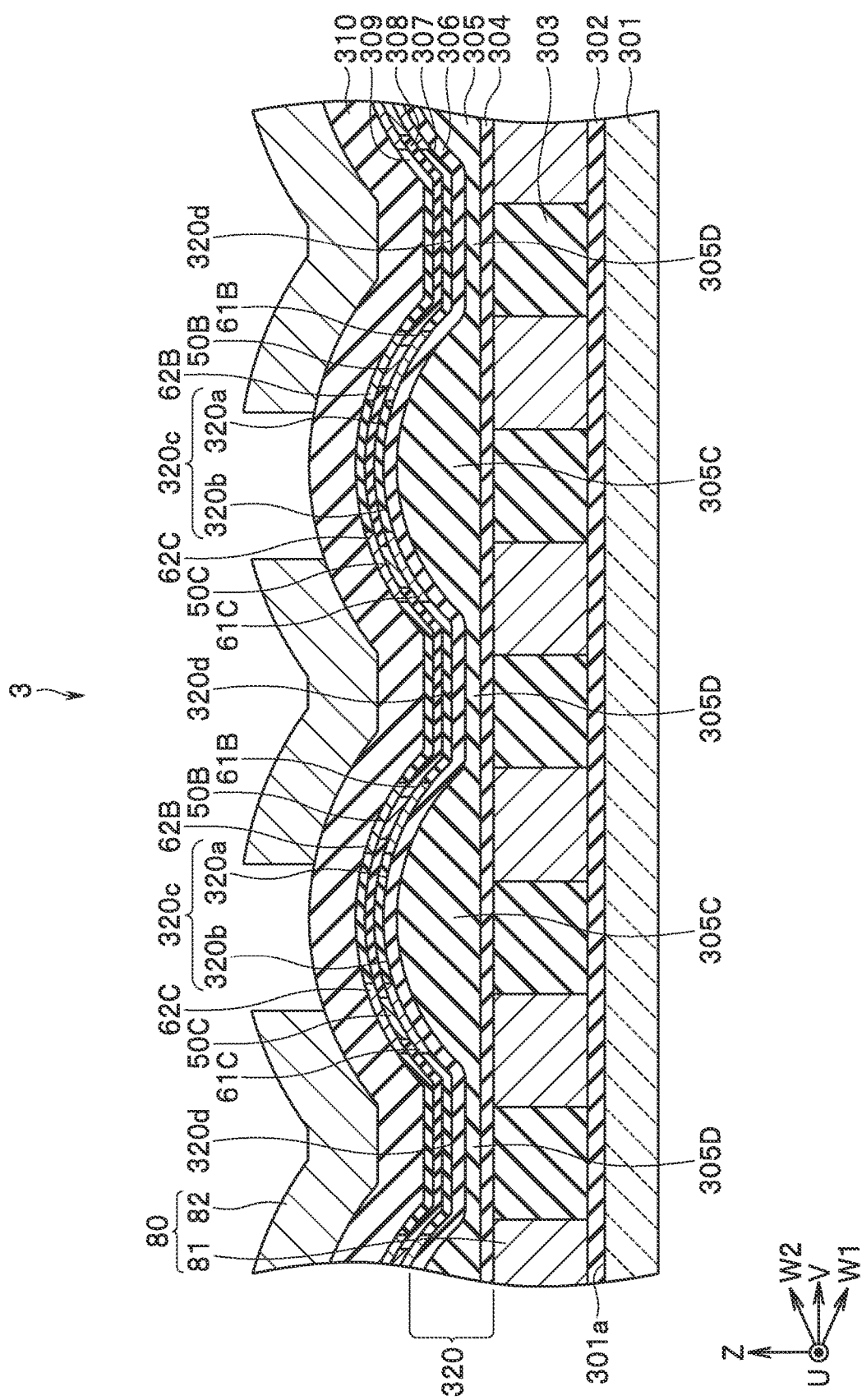
FIG. 10 is a sectional view showing a part of the second chip of the first example embodiment of the technology.

Next, the first to third detection circuits 10, 20, and 30 will be described with reference to FIGS. 3 to 10. FIG. 4 is a circuit diagram showing a circuit configuration of the first detection circuit 10. FIG. 5 is a circuit diagram showing a circuit configuration of the second detection circuit 20. FIG. 6 is a circuit diagram showing a circuit configuration of the third detection circuit 30. FIG. 7 is a plan view showing a part of the first chip 2. FIG. 8 is a sectional view showing a part of the first chip 2. FIG. 9 is a plan view showing a part of the second chip 3. FIG. 10 is a sectional view showing a part of the second chip 3.

Here, as shown in FIGS. 7 and 9, a U direction and a V direction are defined as follows. The U direction is a direction rotated from the X direction to the −Y direction. The V direction is a direction rotated from the Y direction to the X direction. More specifically, in the present example embodiment, the U direction is set to a direction rotated from the X direction to the −Y direction by α, and the V direction is set to a direction rotated from the Y direction to the X direction by α. Note that α is an angle greater than 0° and smaller than 90°. In one example, α is 45°. −U direction refers to a direction opposite to the U direction, and −V direction refers to a direction opposite to the V direction.

As shown in FIG. 10, a W1 direction and a W2 direction are defined as follows. The W1 direction is a direction rotated from the V direction to the −Z direction. The W2 direction is a direction rotated from the V direction to the Z direction. More specifically, in the present example embodiment, the W1 direction is set to a direction rotated from the V direction to the −Z direction by β, and the W2 direction is set to a direction rotated from the V direction to the Z direction by β. Note that β is an angle greater than 0° and smaller than 90°. −W1 direction refers to a direction opposite to the W1 direction, and −W2 direction refers to a direction opposite to the W2 direction. The W1 direction and W2 direction both are orthogonal to the U direction.

The first detection circuit 10 is configured to detect a component of the target magnetic field in a direction parallel to the U direction and generate at least one first detection signal which has a correspondence with the component. The second detection circuit 20 is configured to detect a component of the target magnetic field in a direction parallel to the W1 direction and generate at least one second detection signal which has a correspondence with the component. The third detection circuit 30 is configured to detect a component of the target magnetic field in a direction parallel to the W2 direction and generate at least one third detection signal which has a correspondence with the component.

As shown in FIG. 4, the first detection circuit 10 includes a power supply port V1, a ground port G1, signal output ports E11 and E12, a first resistor section R11, a second resistor section R12, a third resistor section R13, and a fourth resistor section R14. The plurality of MR elements of the first detection circuit 10 constitute the first to fourth resistor sections R11, R12, R13, and R14.

The first resistor section R11 is provided between the power supply port V1 and the signal output port E11. The second resistor section R12 is provided between the signal output port E11 and the ground port G1. The third resistor section R13 is provided between the signal output port E12 and the ground port G1. The fourth resistor section R14 is provided between the power supply port V1 and the signal output port E12.

As shown in FIG. 5, the second detection circuit 20 includes a power supply port V2, a ground port G2, signal output ports E21 and E22, a first resistor section R21, a second resistor section R22, a third resistor section R23, and a fourth resistor section R24. The plurality of MR elements of the second detection circuit 20 constitute the first to fourth resistor sections R21, R22, R23, and R24.

The first resistor section R21 is provided between the power supply port V2 and the signal output port E21. The second resistor section R22 is provided between the signal output port E21 and the ground port G2. The third resistor section R23 is provided between the signal output port E22 and the ground port G2. The fourth resistor section R24 is provided between the power supply port V2 and the signal output port E22.

As shown in FIG. 6, the third detection circuit 30 includes a power supply port V3, a ground port G3, signal output ports E31 and E32, a first resistor section R31, a second resistor section R32, a third resistor section R33, and a fourth resistor section R34. The plurality of MR elements of the third detection circuit 30 constitute the first to fourth resistor sections R31, R32, R33, and R34.

The first resistor section R31 is provided between the power supply port V3 and the signal output port E31. The second resistor section R32 is provided between the signal output port E31 and the ground port G3. The third resistor section R33 is provided between the signal output port E32 and the ground port G3. The fourth resistor section R34 is provided between the power supply port V3 and the signal output port E32.

A voltage or current of predetermined magnitude is applied to each of the power supply ports V1 to V3. Each of the ground ports G1 to G3 is connected to the ground.

The plurality of MR elements of the first detection circuit 10 will hereinafter be referred to as a plurality of first MR elements 50A. The plurality of MR elements of the second detection circuit 20 will be referred to as a plurality of second MR elements 50B. The plurality of MR elements of the third detection circuit 30 will be referred to as a plurality of third MR elements 50C. Since the first to third detection circuits 10, 20, and 30 are components of the magnetic sensor 1, it can be said that the magnetic sensor 1 includes the plurality of first MR elements 50A, the plurality of second MR elements 50B, and the plurality of third MR elements 50C. Any given MR element will be denoted by the reference numeral 50.

Figure 11:
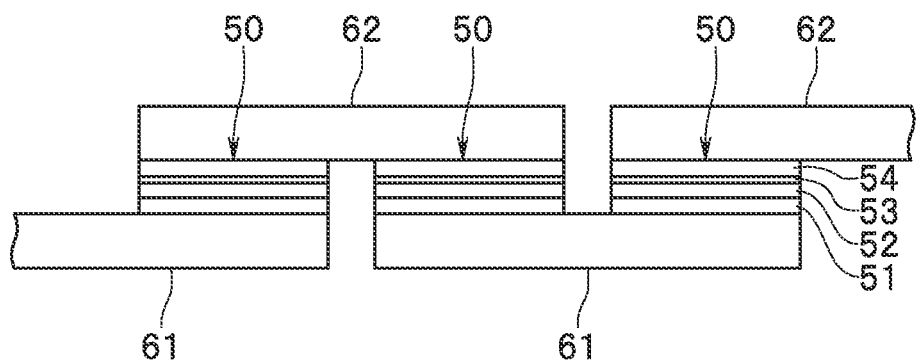
FIG. 11 is a side view showing a magnetoresistive element of the first example embodiment of the technology.

FIG. 11 is a side view showing an MR element 50. The MR element 50 is specifically a spin-valve MR element. The MR element 50 includes a magnetization pinned layer 52 having a magnetization whose direction is fixed, a free layer 54 having a magnetization whose direction is variable depending on the direction of a target magnetic field, and a gap layer 53 located between the magnetization pinned layer 52 and the free layer 54. The MR element 50 may be a tunneling magnetoresistive (TMR) element or a giant magnetoresistive (GMR) element. In the TMR element, the gap layer 53 is a tunnel barrier layer. In the GMR element, the gap layer 53 is a nonmagnetic conductive layer. The resistance of the MR element 50 changes with the angle that the magnetization direction of the free layer 54 forms with respect to the magnetization direction of the magnetization pinned layer 52. The resistance of the MR element 50 is at its minimum value when the foregoing angle is 0°, and at its maximum value when the foregoing angle is 180°. In each MR element 50, the free layer 54 has a shape anisotropy that sets the direction of the magnetization easy axis to be orthogonal to the magnetization direction of the magnetization pinned layer 52. As a method for setting the magnetization easy axis in a predetermined direction in the free layer 54, a magnet configured to apply a bias magnetic field to the free layer 54 can be used.

The MR element 50 further includes an antiferromagnetic layer 51. The antiferromagnetic layer 51, the magnetization pinned layer 52, the gap layer 53, and the free layer 54 are stacked in this order. The antiferromagnetic layer 51 is formed of an antiferromagnetic material, and is in exchange coupling with the magnetization pinned layer 52 to thereby pin the magnetization direction of the magnetization pinned layer 52. The magnetization pinned layer 52 may be a so-called self-pinned layer (Synthetic Ferri Pinned layer, SFP layer). The self-pinned layer has a stacked ferri structure in which a ferromagnetic layer, a nonmagnetic intermediate layer, and a ferromagnetic layer are stacked, and the two ferromagnetic layers are antiferromagnetically coupled. In a case where the magnetization pinned layer 52 is the self-pinned layer, the antiferromagnetic layer 51 may be omitted.

It should be appreciated that the layers 51 to 54 of each MR element 50 may be stacked in the reverse order to that shown in FIG. 11.

In FIGS. 4 to 6, solid arrows represent the magnetization directions of the magnetization pinned layers 52 of the MR elements 50. Hollow arrows represent the magnetization directions of the free layers 54 of the MR elements 50 in a case where no target magnetic field is applied to the MR elements 50.

In the example shown in FIG. 4, the magnetization directions of the magnetization pinned layers 52 in each of the first and third resistor sections R11 and R13 are the U direction. The magnetization directions of the magnetization pinned layers 52 in each of the second and fourth resistor sections R12 and R14 are the −U direction. The free layer 54 in each of the plurality of first MR elements 50A has a shape anisotropy that sets the direction of the magnetization easy axis to a direction parallel to the V direction. The magnetization directions of the free layers 54 in each of the first and second resistor sections R11 and R12 in a case where no target magnetic field is applied to the first MR elements 50A are the V direction. The magnetization directions of the free layers 54 in each of the third and fourth resistor sections R13 and R14 in the foregoing case are the −V direction.

In the example shown in FIG. 5, the magnetization directions of the magnetization pinned layers 52 in each of the first and third resistor sections R21 and R23 are the W1 direction. The magnetization directions of the magnetization pinned layers 52 in each of the second and fourth resistor sections R22 and R24 are the −W1 direction. The free layer 54 in each of the plurality of second MR elements 50B has a shape anisotropy that sets the direction of the magnetization easy axis to a direction parallel to the U direction. The magnetization directions of the free layers 54 in each of the first and second resistor sections R21 and R22 in a case where no target magnetic field is applied to the second MR elements 50B are the U direction. The magnetization directions of the free layers 54 in each of the third and fourth resistor sections R23 and R24 in the foregoing case are the −U direction.

In the example shown in FIG. 6, the magnetization directions of the magnetization pinned layers 52 in each of the first and third resistor sections R31 and R33 are the W2 direction. The magnetization directions of the magnetization pinned layers 52 in each of the second and fourth resistor sections R32 and R34 are the −W2 direction. The free layer 54 in each of the plurality of third MR elements 50C has a shape anisotropy that sets the direction of the magnetization easy axis to a direction parallel to the U direction. The magnetization directions of the free layers 54 in each of the first and second resistor sections R31 and R32 in a case where no target magnetic field is applied to the third MR elements 50C are the U direction. The magnetization directions of the free layers 54 in each of the third and fourth resistor sections R33 and R34 in the foregoing case are the −U direction.

The magnetic sensor 1 includes a magnetic field generator configured to apply a magnetic field in a predetermined direction to the free layer 54 of each of the plurality of first MR elements 50A, the plurality of second MR elements 50B, and the plurality of third MR elements 50C. In the present example embodiment, the magnetic field generator includes a first coil 70 that applies a magnetic field in the predetermined direction to the free layer 54 in each of the first MR elements 50A, and a second coil 80 that applies a magnetic field in the predetermined direction to the free layer 54 in each of the plurality of second MR elements 50B and the plurality of third MR elements 50C. The first chip 2 includes the first coil 70. The second chip 3 includes the second coil 80.

In view of manufacturing accuracy of the MR elements 50 or the like, the magnetization directions of the magnetization pinned layers 52 and the directions of the magnetization easy axes of the free layers 54 may be slightly deviate from the foregoing directions. The magnetization pinned layers 52 may be magnetized to include magnetization components having the foregoing directions as their main components. In such a case, the magnetization directions of the magnetization pinned layers 52 are the same or substantially the same as the foregoing directions.

A specific structure of the first and second chips 2 and 3 will be described in detail below. FIG. 8 shows a part of a cross section at the position indicated by the line 8-8 in FIG. 7.

The first chip 2 includes a substrate 201 having a top surface 201a, insulating layers 202, 203, 204, 205, 206, 207, 208, 209, and 210, a plurality of lower electrodes 61A, a plurality of upper electrodes 62A, a plurality of lower coil elements 71, and a plurality of upper coil elements 72. The top surface 201a of the substrate 201 is parallel to the XY plane. The Z direction is also a direction perpendicular to the top surface 201a of the substrate 201. The coil elements are a part of the coil winding. Since the first chip 2 is a component of the magnetic sensor 1, it can be said that the magnetic sensor 1 includes the substrate 201, the insulating layers 202 to 210, the plurality of lower electrodes 61A, the plurality of upper electrodes 62A, the plurality of lower coil elements 71, and the plurality of upper coil elements 72.

The insulating layer 202 is disposed on the substrate 201. The plurality of lower coil elements 71 are disposed on the insulating layer 202. The insulating layer 203 is disposed around the plurality of lower coil elements 71 on the insulating layer 202. The insulating layers 204, 205, and 206 are stacked in this order on the plurality of lower coil elements 71 and the insulating layer 203.

The plurality of lower electrodes 61A are disposed on the insulating layer 206. The insulating layer 207 is disposed around the plurality of lower electrodes 61A on the insulating layer 206. The plurality of first MR elements 50A are disposed on the plurality of lower electrodes 61A. The insulating layer 208 is disposed around the plurality of first MR elements 50A on the plurality of lower electrodes 61A and the insulating layer 207. The plurality of upper electrodes 62A are disposed on the plurality of first MR elements 50A and the insulating layer 208. The insulating layer 209 is disposed around the plurality of upper electrodes 62A on the insulating layer 208.

The insulating layer 210 is disposed on the plurality of upper electrodes 62A and the insulating layer 209. The plurality of upper coil elements 72 are disposed on the insulating layer 210. The first chip 2 may further include a not-shown insulating layer that covers the plurality of upper coil elements 72 and the insulating layer 210. FIG. 7 shows the insulating layer 206, the plurality of first MR elements 50A, and the plurality of upper coil elements 72 among the components of the first chip 2.

The top surface 201a of the substrate 201 is parallel to the XY plane. The top surface of each of the plurality of lower electrodes 61A is also parallel to the XY plane. In the foregoing state, the plurality of first MR elements 50A can therefore be said to be disposed on a flat surface parallel to the XY plane.

As shown in FIG. 7, the plurality of first MR elements 50A are disposed so that two or more MR elements 50A are arranged both in the U direction and in the V direction. The plurality of first MR elements 50A are connected in series by the plurality of lower electrodes 61A and the plurality of upper electrodes 62A. When seen in the Z direction, two adjoining first MR elements 50A may be displaced or not displaced in the direction parallel to the V direction.

A method for connecting the plurality of first MR elements 50A will now be described in detail with reference to FIG. 11. In FIG. 11, the reference numerals 61 denote lower electrodes corresponding to given MR elements 50, and the reference numerals 62 denote upper electrodes corresponding to the MR elements 50. As shown in FIG. 11, each lower electrode 61 has a long slender shape. Two lower electrodes 61 adjoining in the longitudinal direction of the lower electrodes 61 have a gap therebetween. MR elements 50 are disposed near both longitudinal ends on the top surface of each lower electrode 61. Each upper electrode 62 has a long slender shape, and electrically connects two adjoining MR elements 50 that are disposed on two lower electrodes 61 adjoining in the longitudinal direction of the lower electrodes 61.

Although not shown in the drawings, an MR element 50 located at the end of a row of MR elements 50 is connected to another MR element 50 located at the end of another row of MR elements 50 adjoining in a direction intersecting with the longitudinal direction of the lower electrodes 61. The two MR elements 50 are connected to each other by a not-shown electrode. The not-shown electrode may be an electrode connecting the bottom surfaces of the two MR elements 50 or the top surfaces of the same.

If the MR elements 50 shown in FIG. 11 are first MR elements 50A, the lower electrodes 61 shown in FIG. 11 correspond to lower electrodes 61A, and the upper electrodes 62 shown in FIG. 11 correspond to upper electrodes 62A. In such a case, the longitudinal direction of the lower electrodes 61 is parallel to the V direction.

In the example embodiment, an MR element 50 is described to be a layered film including an antiferromagnetic layer 51, a magnetization pinned layer 52, a gap layer 53, and a free layer 54. However, the layered film accompanied by a lower electrode 61 and an upper electrode 62 may be regarded as an MR element according to the example embodiment. The layered film includes a plurality of magnetic films.

Each of the plurality of upper coil elements 72 extends in a direction parallel to the Y direction. The plurality of upper coil elements 72 are arranged in the X direction. In particular, in the present example embodiment, when seen in the Z direction, each of the plurality of first MR elements 50A overlaps two upper coil elements 72.

Each of the plurality of lower coil elements 71 extends in a direction parallel to the Y direction. The plurality of lower coil elements 71 are arranged in the X direction. The shape and arrangement of the plurality of lower coil elements 71 may be the same as or different from those of the plurality of upper coil elements 72. In the example shown in FIGS. 7 and 8, the dimension of each of the plurality of lower coil elements 71 in the X direction is smaller than that of each of the plurality of upper coil elements 72 in the X direction. The distance between two lower coil elements 71 adjoining in the X direction is smaller than that between two upper coil elements 72 adjoining in the X direction.

In the example shown in FIGS. 7 and 8, the plurality of lower coil elements 71 and the plurality of upper coil elements 72 are electrically connected to constitute the first coil 70 that applies a magnetic field in a direction parallel to the X direction to the free layers 54 of the respective first MR elements 50A. The first coil 70 may be configured so that a magnetic field in the X direction can be applied to the free layers 54 in the first and second resistor sections R11 and R12 and a magnetic field in the −X direction can be applied to the free layers 54 in the third and fourth resistor sections R13 and R14. The first coil 70 may be controlled by the processor 40.

Next, a structure of the second chip 3 will be described with reference to FIGS. 9 and 10. FIG. 10 shows a part of a cross section at the position indicated by the line 10-10 in FIG. 9.

The second chip 3 includes a substrate 301 having a top surface 301a, insulating layers 302, 303, 304, 305, 306, 307, 308, 309, and 310, a plurality of lower electrodes 61B, a plurality of lower electrodes 61C, a plurality of upper electrodes 62B, a plurality of upper electrodes 62C, a plurality of lower coil elements 81, and a plurality of upper coil elements 82. The top surface 301a of the substrate 301 is parallel to the XY plane. The Z direction is also a direction perpendicular to the top surface 301a of the substrate 301. Since the second chip 3 is a component of the magnetic sensor 1, it can be said that the magnetic sensor 1 includes the substrate 301, the insulating layers 302 to 310, the plurality of lower electrodes 61B, the plurality of lower electrodes 61C, the plurality of upper electrodes 62B, the plurality of upper electrodes 62C, the plurality of lower coil elements 81, and the plurality of upper coil elements 82.

The insulating layer 302 is disposed on the substrate 301. The plurality of lower coil elements 81 are disposed on the insulating layer 302. The insulating layer 303 is disposed around the plurality of lower coil elements 81 on the insulating layer 302. The insulating layers 304, 305, and 306 are stacked in this order on the plurality of lower coil elements 81 and the insulating layer 303.

The plurality of lower electrodes 61B and the plurality of lower electrodes 61C are disposed on the insulating layer 306. The insulating layer 307 is disposed around the plurality of lower electrodes 61B and around the plurality of lower electrodes 61C on the insulating layer 306. The plurality of second MR elements 50B are disposed on the plurality of lower electrodes 61B. The plurality of third MR elements 50C are disposed on the plurality of lower electrodes 61C. The insulating layer 308 is disposed around the plurality of second MR elements 50B and around the plurality of third MR elements 50C on the plurality of lower electrodes 61B, the plurality of lower electrodes 61C, and the insulating layer 307. The plurality of upper electrodes 62B are disposed on the plurality of second MR elements 50B and the insulating layer 308. The plurality of upper electrodes 62C are disposed on the plurality of third MR elements 50C and the insulating layer 308. The insulating layer 309 is disposed around the plurality of upper electrodes 62B and around the plurality of upper electrodes 62C on the insulating layer 308.

The insulating layer 310 is disposed on the plurality of upper electrodes 62B, the plurality of upper electrodes 62C, and the insulating layer 309. The plurality of upper coil elements 82 are disposed on the insulating layer 310. The second chip 3 may further include a not-shown insulating layer that covers the plurality of upper coil elements 82 and the insulating layer 310.

The second chip 3 includes a support member 320 that supports the plurality of second MR elements 50B and the plurality of third MR elements 50C. The support member 320 has at least one inclined surface inclined relative to the top surface 301a of the substrate 301. In particular, in the present example embodiment, the support member 320 includes the insulating layers 304, 305, and 306. FIG. 9 shows the support member 320, a plurality of second MR elements 50B, a plurality of third MR elements 50C, and a plurality of upper coil elements 82 among the components of the second chip 3.

The support member 320 includes a plurality of protruding surfaces 320c each protruding in a direction away from the top surface 301a of the substrate 301 (Z direction). The plurality of protruding surfaces 320c each extend in the direction parallel to the U direction. The overall shape of each protruding surface 320c is a semicylindrical curved surface formed by moving the curved shape (arch shape) of the protruding surface 320c shown in FIG. 10 along the direction parallel to the U direction. The plurality of protruding surfaces 320c are arranged at predetermined intervals along a direction parallel to the V direction.

The plurality of protruding surfaces 320c each have an upper end farthest from the top surface 301a of the substrate 301. In the example embodiment, the upper ends of the respective protruding surface 320c extend in the direction parallel to the U direction. Now, focus attention on one of the protruding surfaces 320c. The protruding surface 320c includes a first inclined surface 320a and a second inclined surface 320b. The first inclined surface 320a refers to the part of the protruding surface 320c on the V direction side of the upper end of the protruding surface 320c. The second inclined surface 320b refers to the part of the protruding surface 320c on the −V direction side of the upper end of the protruding surface 320c. In FIG. 9, the border between the first and second inclined surfaces 320a and 320b is shown by a dotted line.

The upper end of the protruding surface 320c may be the border between the first and second inclined surfaces 320a and 320b. In such a case, the dotted line shown in FIG. 9 represents the upper end of the protruding surface 320c.

The top surface 301a of the substrate 301 is parallel to the XY plane. The first and second inclined surfaces 320a and 320b are each inclined relative to the top surface 301a of the substrate 301, i.e., the XY plane. In a cross section perpendicular to the top surface 301a of the substrate 301, the distance between the first and second inclined surfaces 320a and 320b decreases with increasing distance from the top surface 301a of the substrate 301.

In the example embodiment, there are a plurality of protruding surfaces 320c, and thus there are a plurality of first inclined surfaces 320a and a plurality of second inclined surfaces 320b. The support member 320 includes the plurality of first inclined surfaces 320a and the plurality of second inclined surfaces 320b.

The support member 320 further includes a flat surface 320d around the plurality of protruding surfaces 320c. The flat surface 320d is a surface parallel to the top surface 301a of the substrate 301. The plurality of protruding surfaces 320c each protrude from the flat surface 320d in the Z direction. In the example embodiment, the plurality of protruding surfaces 320c are located at predetermined intervals. The flat surface 320d is thus interposed between two protruding surfaces 320c adjoining in the V direction.

In the example embodiment, the plurality of protruding surfaces 320c and the flat surface 320d are formed substantially by the insulating layer 305. More specifically, the insulating layer 305 includes a plurality of protrusions 305C each protruding in the Z direction and a flat portion 305D disposed around the plurality of protrusions 305C. The plurality of protrusions 305C each extend in the direction parallel to the U direction and have a top surface having a shape corresponding to the protruding surface 320c. The plurality of protrusions 305C are arranged at predetermined intervals along the direction parallel to the V direction. The flat portion 305D has a substantially constant thickness (dimension in the Z direction). The insulating layer 306 has a substantially constant thickness (dimension in the Z direction) and is formed along the top surface of the insulating layer 305. The top surface of the insulating layer 306 thus forms the plurality of protruding surfaces 320c and the flat surface 320d.

The insulating layer 304 has a substantially constant thickness (dimension in the Z direction) and is formed along the bottom surface of the insulating layer 305.

The plurality of lower electrodes 61B are disposed on the plurality of first inclined surfaces 320a. The plurality of lower electrodes 61C are disposed on the plurality of second inclined surfaces 320b. As describe above, the first and second inclined surfaces 320a and 320b are each inclined relative to the top surface 301a of the substrate 301, i.e., the XY plane. The top surface of each of the plurality of lower electrodes 61B and the top surface of each of the plurality of lower electrode 61C are thus also inclined relative to the XY plane. Thus, it can be said that the plurality of second MR elements 50B and the plurality of third MR elements 50C are disposed on inclined surfaces inclined relative to the XY plane. The support member 320 is a member for supporting each of the plurality of second MR elements 50B and the plurality of third MR elements 50C to incline relative to the XY plane.

In the present example embodiment, the first inclined surfaces 320a are curved surfaces. The second MR elements 50B are thus curved along the curved surfaces (first inclined surfaces 320a). For the sake of convenience, in the present example embodiment, the magnetization directions of the magnetization pinned layers 52 of the second MR elements 50B are defined as straight directions as described above. The W1 direction and the −W1 direction that are the magnetization directions of the magnetization pinned layers 52 of the second MR elements 50B are also directions in which the tangents to the first inclined surfaces 320a at the vicinity of the second MR elements 50B extend.

Similarly, in the example embodiment, the second inclined surfaces 320b are curved surfaces. The third MR elements 50C are thus curved along the curved surfaces (second inclined surfaces 320b). For the sake of convenience, in the present example embodiment, the magnetization directions of the magnetization pinned layers 52 of the third MR elements 50C are defined as straight directions as described above. The W2 direction and the −W2 direction that are the magnetization directions of the magnetization pinned layers 52 of the third MR elements 50C are also directions in which the tangents to the second inclined surfaces 320b at the vicinity of the third MR elements 50C extend.

As shown in FIG. 9, the plurality of second MR elements 50B are disposed so that two or more MR elements 50B are arranged both in the U direction and in the V direction. A plurality of second MR elements 50B are arranged in a row on one first inclined surface 320a. Similarly, the plurality of third MR elements 50C are disposed so that two or more MR elements 50C are arranged both in the U direction and in the V direction. A plurality of third MR elements 50C are arranged in a row on one second inclined surface 320b. In the example embodiment, a plurality of rows of second MR elements 50B and a plurality of rows of third MR elements 50C are alternately arranged in the direction parallel to the V direction.

When seen in the Z direction, a second MR element 50B and a third MR element 50C adjoining each other may be displaced or not displaced in the direction parallel to the U direction. When seen in the Z direction, two second MR elements 50B adjoining with a third MR element 50C therebetween may be displaced or not displaced in the direction parallel to the U direction. When seen in the Z direction, two third MR elements 50C adjoining with a second MR element 50B therebetween may be displaced or not displaced in the direction parallel to the U direction.

The plurality of second MR elements 50B are connected in series by the plurality of lower electrodes 61B and the plurality of upper electrodes 62B. The foregoing description of the method for connecting the plurality of first MR elements 50A also applies to a method for connecting the plurality of second MR elements 50B. If the MR elements 50 shown in FIG. 11 are second MR elements 50B, the lower electrodes 61 shown in FIG. 11 correspond to lower electrodes 61B, and the upper electrode 62 shown in FIG. 11 correspond to upper electrodes 62B. In such a case, the longitudinal direction of the lower electrodes 61 is parallel to the U direction.

Similarly, the plurality of third MR elements 50C are connected in series by the plurality of lower electrodes 61C and the plurality of upper electrodes 62C. The foregoing description of the method for connecting the plurality of first MR elements 50A also applies to a method for connecting the plurality of third MR elements 50C. If the MR elements 50 shown in FIG. 11 are third MR elements 50C, the lower electrodes 61 shown in FIG. 11 correspond to lower electrodes 61C, and the upper electrodes 62 shown in FIG. 11 correspond to upper electrodes 62C. In such a case, the longitudinal direction of the lower electrodes 61 is parallel to the U direction.

Each of the plurality of upper coil elements 82 extends in a direction parallel to the Y direction. The plurality of upper coil elements 82 are arranged in the X direction. In particular, in the present example embodiment, when seen in the Z direction, each of the plurality of second MR elements 50B and the plurality of third MR elements 50C overlaps two upper coil elements 82.

Each of the plurality of lower coil elements 81 extends in a direction parallel to the Y direction. The plurality of lower coil elements 81 are arranged in the X direction. The shape and arrangement of the plurality of lower coil elements 81 may be the same as or different from those of the plurality of upper coil elements 82. In the example shown in FIGS. 9 and 10, the dimension of each of the plurality of lower coil elements 81 in the X direction is smaller than the dimension of each of the plurality of upper coil elements 82 in the X direction. The distance between two lower coil elements 81 adjoining in the X direction is smaller than that between two upper coil elements 82 adjoining in the X direction.

In the example shown in FIGS. 9 and 10, the plurality of lower coil elements 81 and the plurality of upper coil elements 82 are electrically connected to constitute the second coil 80 that applies a magnetic field in the direction parallel to the X direction to the free layer 54 in each of the plurality of second MR elements 50B and the plurality of third MR elements 50C. The second coil 80 may be configured, for example, so that a magnetic field in the X direction can be applied to the free layers 54 in the first and second resistor sections R21 and R22 of the second detection circuit 20 and the first and second resistor sections R31 and R32 of the third detection circuit 30, and a magnetic field in the −X direction can be applied to the free layers 54 in the third and fourth resistor sections R23 and R24 of the second detection circuit 20 and the third and fourth resistor sections R33 and R34 of the third detection circuit 30. The second coil 80 may be controlled by the processor 40.

Next, the first to third detection signals will be described. The first detection signal will initially be described with reference to FIG. 4. As the strength of the component of the target magnetic field in the direction parallel to the U direction changes, the resistance of each of the resistor sections R11 to R14 of the first detection circuit 10 changes either so that the resistances of the resistor sections R11 and R13 increase and the resistances of the resistor sections R12 and R14 decrease or so that the resistances of the resistor sections R11 and R13 decrease and the resistances of the resistor sections R12 and R14 increase. Thereby the electric potential of each of the signal output ports E11 and E12 changes. The first detection circuit 10 generates a signal corresponding to the electric potential of the signal output port E11 as a first detection signal S11, and generates a signal corresponding to the electric potential of the signal output port E12 as a first detection signal S12.

Next, the second detection signal will be described with reference to FIG. 5. As the strength of the component of the target magnetic field in the direction parallel to the W1 direction changes, the resistance of each of the resistor sections R21 to R24 of the second detection circuit 20 changes either so that the resistances of the resistor sections R21 and R23 increase and the resistances of the resistor sections R22 and R24 decrease or so that the resistances of the resistor sections R21 and R23 decrease and the resistances of the resistor sections R22 and R24 increase. Thereby the electric potential of each of the signal output ports E21 and E22 changes. The second detection circuit 20 generates a signal corresponding to the electric potential of the signal output port E21 as a second detection signal S21, and generates a signal corresponding to the electric potential of the signal output port E22 as a second detection signal S22.

Next, the third detection signal will be described with reference to FIG. 6. As the strength of the component of the target magnetic field in the direction parallel to the W2 direction changes, the resistance of each of the resistor sections R31 to R34 of the third detection circuit 30 changes either so that the resistances of the resistor sections R31 and R33 increase and the resistances of the resistor sections R32 and R34 decrease or so that the resistances of the resistor sections R31 and R33 decrease and the resistances of the resistor sections R32 and R34 increase. Thereby the electric potential of each of the signal output ports E31 and E32 changes. The third detection circuit 30 generates a signal corresponding to the electric potential of the signal output port E31 as a third detection signal S31, and generates a signal corresponding to the electric potential of the signal output port E32 as a third detection signal S32.

Next, an operation of the processor 40 will be described. The processor 40 is configured to generate the first detection value based on the first detection signals S11 and S12. The first detection value is a detection value corresponding to the component of the target magnetic field in the direction parallel to the U direction. The first detection value will hereinafter be represented by the symbol Su.

In the present example embodiment, the processor 40 generates a first detection value Su by an arithmetic including obtainment of the difference S11−S12 between the first detection signal S11 and the first detection signal S12. The first detection value Su may be the difference S11−S12 itself. The first detection value Su may be obtained by making predetermined corrections such as gain adjustment and offset adjustment to the difference S11−S12.

The processor 40 is further configured to generate the second and third detection values based on the second detection signals S21 and S22 and the third detection signals S31 and S32. The second detection value is a detection value corresponding to the component of the target magnetic field in the direction parallel to the V direction. The third detection value is a detection value corresponding to the component of the target magnetic field in the direction parallel to the Z direction. The second detection value is represented by a symbol Sv, and the third detection value is represented by a symbol Sz.

The processor 40 generates the second and third detection values Sv and Sz as follows, for example. First, the processor 40 generates a value S2 by an arithmetic including obtainment of the difference S21−S22 between the second detection signal S21 and the second detection signal S22, and generates a value S2 by an arithmetic including obtainment of the difference S31−S32 between the third detection signal S31 and the third detection signal S32. Next, the processor 40 calculates values S3 and S4 using the following expressions (1) and (2).

$$S3=(S2+S1)/(2\cos\alpha) \quad (1)$$

$$S4=(S2-S1)/(2\sin\alpha) \quad (2)$$

The second detection value Sv may be the value S3 itself, or may be a result of a predetermined correction, such as a gain adjustment or an offset adjustment, made to the value S3. In the same manner, the third detection value Sz may be the value S4 itself, or may be a result of a predetermined correction, such as a gain adjustment or an offset adjustment, made to the value S4.

Next, structural features of the magnetic sensor 1 will be described. Features of the first chip 2 of the magnetic sensor 1 will initially be described with reference to FIG. 8. The first chip 2 includes the insulating layers 204, 205, and 206 arranged in order along the Z direction, the lower coil elements 71 that are each a metal layer, and the first MR elements 50A that are each a sensor element.

Each of the first MR elements 50A includes at least two magnetic films, namely, the magnetization pinned layer 52 and the free layer 54. The two magnetic films constitute a part (essential part) of the first MR element 50A. The two magnetic films will hereinafter be referred to as a functional layer. The functional layer is located on the opposite side of the insulating layer 206 from the insulating layer 205.

The lower coil elements 71 are located on the opposite side of the insulating layer 204 from the insulating layer 205. The lower coil elements 71 are a part of the first coil 70. The lower coil elements 71 are formed of Cu, Au, or Al, for example.

The insulating layers 204 and 206 each contain a first insulating material. The insulating layer 205 contains a second insulating material. The second insulating material is different from the first insulating material. The second insulating material preferably has a fracture toughness value higher than that of the metal layer, i.e., the lower coil elements 71. The second insulating material may be $SiO_2$, for example.

The first insulating material preferably has a fracture toughness value higher than that of the second insulating material. The first insulating material may be $Al_2O_3$, SiN, AlN, or MgO, for example. In particular, if the second insulating material is $SiO_2$, $Al_2O_3$ may be used as the first insulating material. The insulating layers 204 and 206 are preferably formed of the same first insulating material.

The insulating layer 205 includes a flat portion having a constant dimension in the Z direction. The functional layer (magnetization pinned layer 52 and free layer 54) is disposed along the flat portion. The maximum dimension of the insulating layer 205 in the Z direction may be greater than that of the insulating layer 204 in the Z direction and that of the insulating layer 206 in the Z direction.

Next, features of the second chip 3 of the magnetic sensor 1 will be described with reference to FIG. 10. The second chip 3 includes the insulating layers 304, 305, and 306 arranged in order along the Z direction, the lower coil elements 81 that are each a metal layer, and the second and third MR elements 50B and 50C that are sensor elements.

Like the first MR elements 50A, the second and third MR elements 50B and 50C each include at least a functional layer (magnetization pinned layer 52 and free layer 54). The functional layer of each of the second and third MR elements 50B and 50C is located on the opposite side of the insulating layer 306 from the insulating layer 305.

The lower coil elements 81 are located on the opposite side of the insulating layer 304 from the insulating layer 305. The lower coil elements 81 are a part of the second coil 80. The lower coil elements 81 are formed of Cu, Au, or Al, for example.

Like the insulating layers 204 and 206, the insulating layers 304 and 306 each contain the first insulating material.

Like the insulating layer 205, the insulating layer 305 contains the second insulating material. The insulating layers 304 and 306 are preferably formed of the same first insulating material.

The insulating layer 305 includes a first portion and a second portion located at a position different from the first portion in a direction orthogonal to the Z direction. The maximum dimension of the second portion in the Z direction is greater than that of the first portion in the Z direction. In the example embodiment, the flat portion 305D of the insulating layer 305 corresponds to the first portion. The protrusions 305C of the insulating layer 305 correspond to the second portion.

The protrusions 305C include the first and second inclined surfaces inclined relative to the Z direction. The first inclined surfaces 320a of the support member 320 have a shape corresponding to the first inclined surfaces of the protrusions 305C. The second inclined surfaces 320b of the support member 320 have a shape corresponding to the second inclined surfaces of the protrusions 305C. The functional layers of the second MR elements 50B are disposed along the first inclined surfaces of the protrusions 305C. The functional layers of the third MR elements 50C are disposed along the second inclined surfaces of the protrusions 305C.

As described above, the protrusions 305C extend in the direction parallel to the U direction. The lower coil elements 81 extend in the direction parallel to the Y direction. When seen in the Z direction, the lower coil elements 81 thus extend to intersect the borders between the protrusions 305C and the flat portion 305D.

Next, the operation and effects of the magnetic sensor 1 according to the example embodiment will be described. A description will initially be given by using the first chip 2 as an example. In the present example embodiment, the insulating layers 204, 205, and 206 are interposed between the lower coil elements 71 and the first MR elements 50A. A magnetic sensor including insulating layers between a metal layer and MR elements can cause a crack in the insulating layer in the process of manufacturing the magnetic sensor due to a difference in the materials between the metal layer and the insulating layer.

By contrast, in the present example embodiment, the layered structure including the insulating layers 204, 205, and 206 is interposed between the lower coil elements 71 and the first MR elements 50A. This prevents the insulating layers 204, 205, and 206 from cracking. One of the reasons for the prevention of cracking is as follows. Assuming one insulating layer having the same thickness as the total thickness of the insulating layers 204, 205, and 206, each of the insulating layers 204, 205, and 206 has a small thickness compared to the one insulating layer. Each of the insulating layers 204, 205, and 206 thus includes fewer defects.

In the course of the study, the inventors of the present invention have found that the probability of cracking varies depending on the combination of the insulating materials constituting the respective insulating layers 204, 205, and 206. In the present example embodiment, the insulating layers 204 and 206 each contain the first insulating material. The insulating layer 205 contains the second insulating material. In other words, in the present example embodiment, the insulating layer 204 disposed on the bottom surface side of the insulating layer 205 and the insulating layer 206 disposed on the top surface side of the insulating layer 205 are formed of the same insulating material. According to the present example embodiment, the insulating layer 205 can thus be prevented from cracking due to a difference in the materials between the layer formed on the bottom surface side of the insulating layer 205 and the layer formed on the top surface side of the insulating layer 205.

In the present example embodiment, the second insulating material preferably has a fracture toughness value higher than that of the metal material constituting the lower coil element 71. According to the present example embodiment, the cracking of the insulating layer 205 can thereby be more effectively prevented. Moreover, in the present example embodiment, the first insulating material preferably has a fracture toughness value higher than that of the second insulating material. According to the example embodiment, the cracking of the insulating layers 204, 205, and 206 can thereby be more effectively prevented.

The foregoing description of the first chip 2 is also applicable to the second chip 3. The description applies to the second chip 3 if the insulating layers 204, 205, and 206 and the lower coil elements 71 in the foregoing description of the first chip 2 are replaced with the insulating layers 304, 305, and 306 and the lower coil elements 81, respectively, and the first MR elements 50A are replaced with the second or third MR elements 50B or 50C.

The insulating layer 305 of the second chip 3 has a discontinuous structure including the protrusions 305C and the flat portion 305D. In particular, in the second chip 3, the lower coil elements 81 extend to intersect the borders between the protrusions 305C and the flat portion 305D. The insulating layer 305 is therefore likely to crack compared to insulating layers having a uniform structure. In view of this, according to the example embodiment, the insulating layer 304 is disposed on the bottom surface side of the insulating layer 305, and the insulating layer 306 is disposed on the top surface side of the insulating layer 305. The insulating layer 305 can thereby be prevented from cracking.

Modification Example

Next, a modification example of the second chip 3 according to the example embodiment will be described with reference to FIG. 12. In the modification example, each of the plurality of protruding surfaces 320c of the support member 320 in the second chip 3 has a triangular roof-like overall shape formed by moving the triangular shape of the protruding surface 320c shown in FIG. 12 in the direction parallel to the U direction. All the plurality of first inclined surfaces 320a and the plurality of second inclined surfaces 320b of the support member 320 are flat surfaces. Each of the plurality of first inclined surfaces 320a is a flat surface parallel to the U direction and the W1 direction. Each of the plurality of second inclined surfaces 320b is a flat surface parallel to the U direction and the W2 direction.

Like the example shown in FIG. 10, the insulating layer 305 may include a plurality of protrusions for forming the plurality of protruding surfaces 320c. Alternatively, the insulating layer 305 may include a plurality of slopes arranged in the direction parallel to the V direction. The plurality of slopes each include a first wall surface corresponding to a first inclined surface 320a and a second wall surface corresponding to a second inclined surface 320b. A protruding surface 320c is constituted by the first wall surface of one slope and the second wall surface of another slope adjoining on the −V direction side of the one slope.

Figure 12:
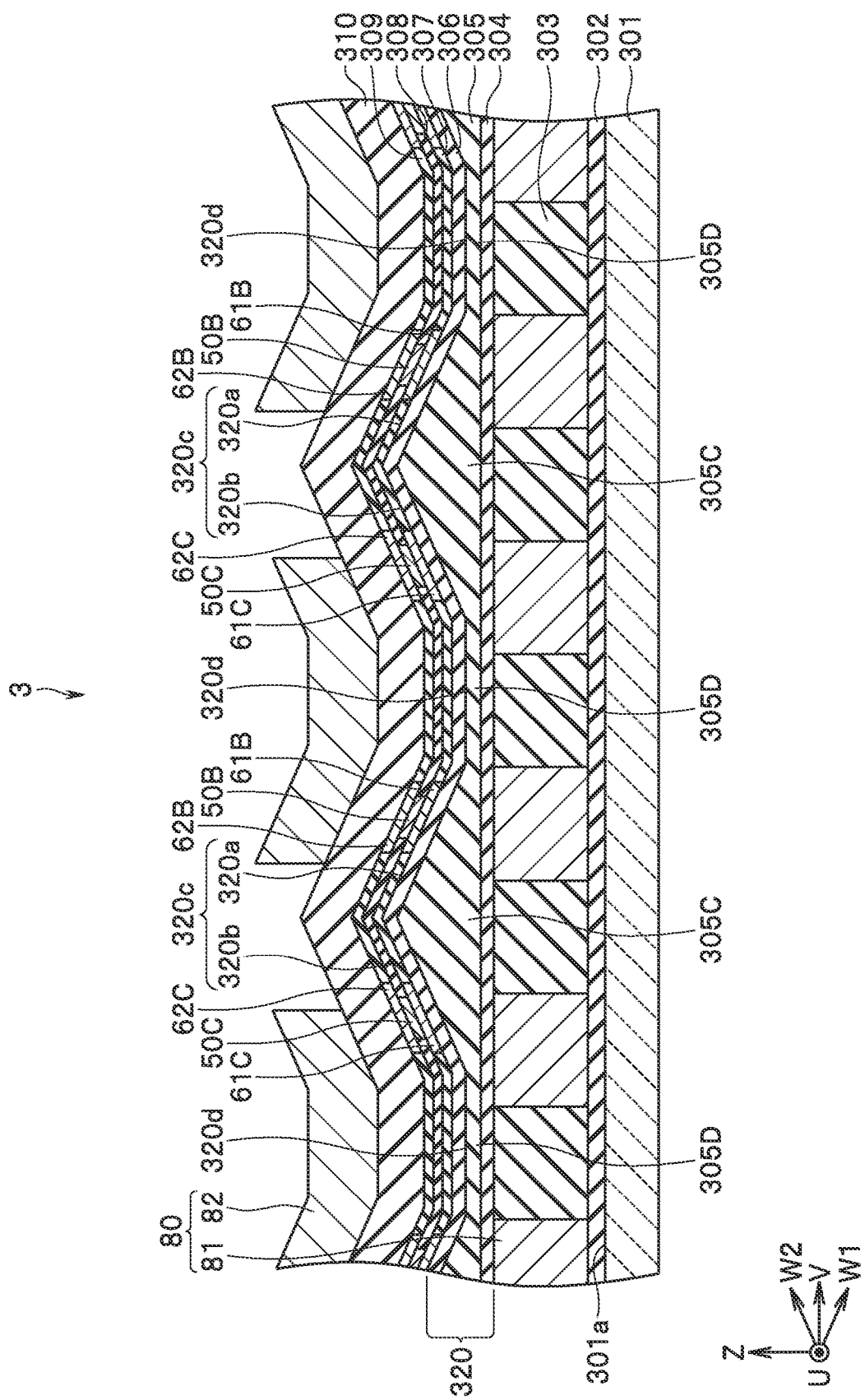
FIG. 12 is a sectional view showing a modification example of the second chip of the first example embodiment of the technology.

In the example shown in FIG. 12, the plurality of slopes each have a bottom surface corresponding to the flat surface 320d. However, the plurality of slopes do not need to have a bottom surface each.

Second Example Embodiment

Figure 13:
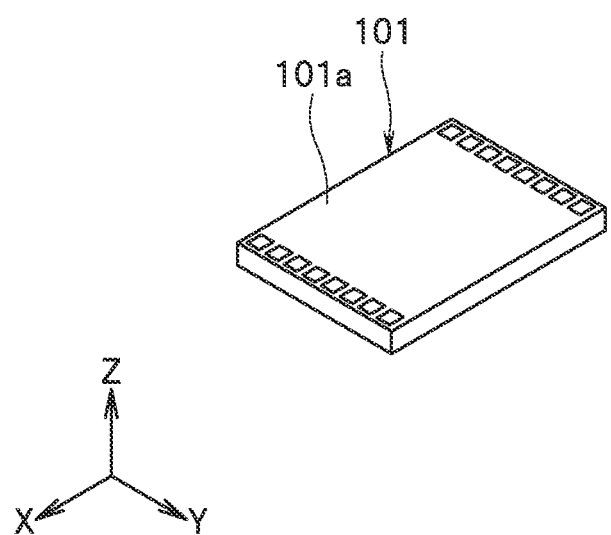
FIG. 13 is a perspective view showing a magnetic sensor according to a second example embodiment of the technology.
Figure 14:
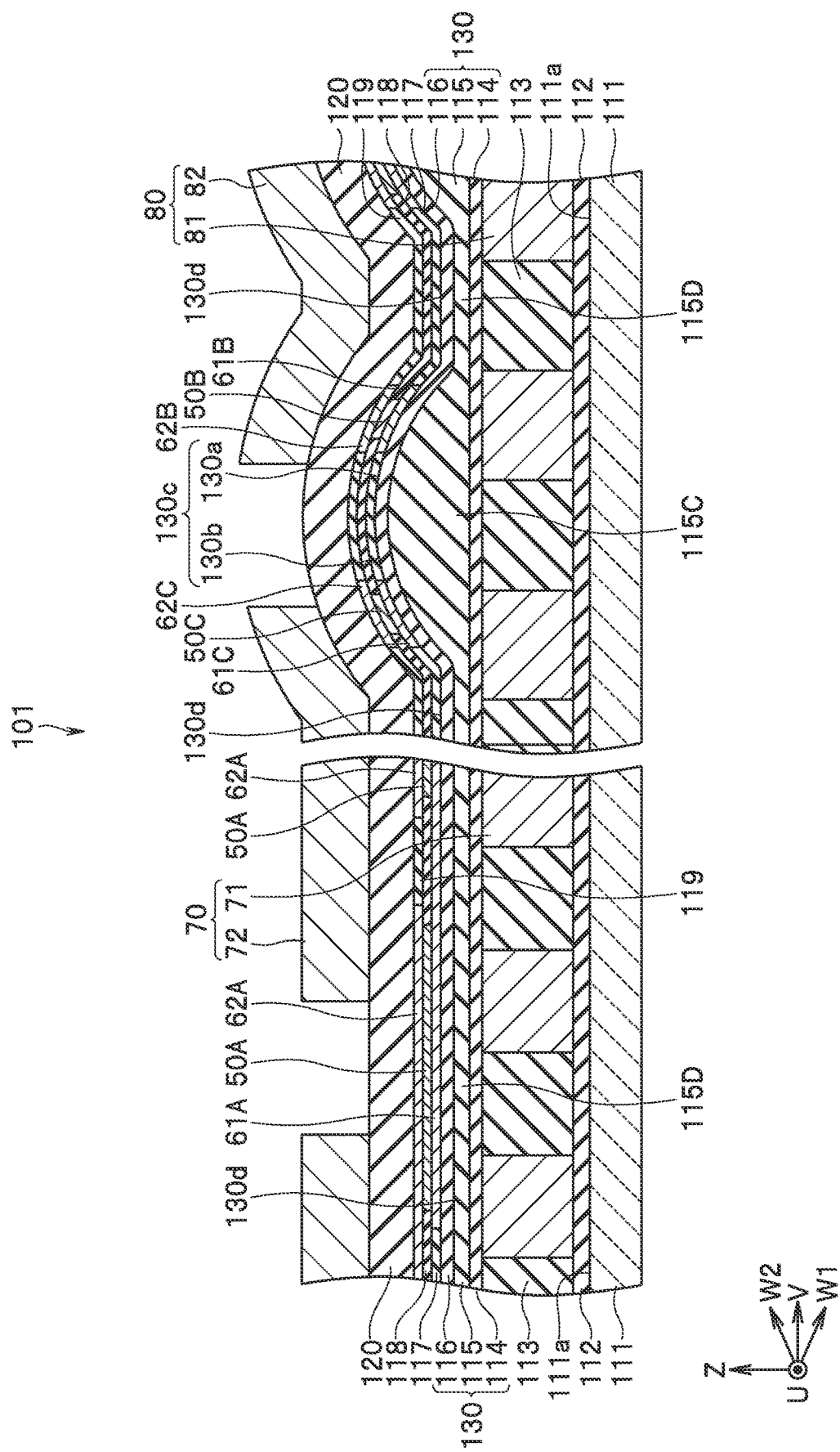
FIG. 14 is a sectional view showing a part of the magnetic sensor according to the second example embodiment of the technology.

Next, a magnetic sensor according to a second example embodiment of the technology will be described with reference to FIGS. 13 and 14. FIG. 13 is a perspective view showing a magnetic sensor according to the example embodiment. FIG. 14 is a sectional view showing a part of the magnetic sensor according to the example embodiment.

A magnetic sensor 101 according to the example embodiment is equivalent to the first and second chips 2 and 3 according to the first example embodiment integrated. As shown in FIG. 13, the magnetic sensor 101 has the shape of a rectangular solid chip. The magnetic sensor 101 has a top surface 101a and a bottom surface located opposite to each other, and four side surfaces connecting the top surface 101a and the bottom surface. The magnetic sensor 101 also includes a plurality of electrode pads disposed on the top surface 101a.

The magnetic sensor 101 may be mounted on the support 4 shown in FIGS. 1 and 2 according to the first example embodiment. In such a case, the magnetic sensor 101 is mounted on the reference plane 4a of the support 4 with the bottom surface of the magnetic sensor 101 facing the reference plane 4a.

The magnetic sensor 101 includes the first to third detection circuits 10, 20, and 30 and the first and second coils 70 and 80 shown in FIGS. 3 to 6 according to the first example embodiment. The configuration and operation of each of the first to third detection circuits 10, 20, and 30 and the first and second coils 70 and 80 are similar to those in the first example embodiment. More specifically, the first detection circuit 10 includes a plurality of first MR elements 50A. The second detection circuit 20 includes a plurality of second MR elements 50B. The third detection circuit 30 includes a plurality of third MR elements 50C. The first coil 70 includes a plurality of lower coil elements 71 and a plurality of upper coil elements 72. The second coil 80 includes a plurality of lower coil elements 81 and a plurality of upper coil elements 82.

The magnetic sensor 101 further includes the plurality of lower electrodes 61A, 61B, and 61C and the plurality of upper electrodes 62A, 62B, and 62C described in the first example embodiment. The respective methods for connecting the plurality of first MR elements 50A, the plurality of second MR elements 50B, and the plurality of third MR elements 50C are similar to those in the first example embodiment.

As shown in FIG. 14, the magnetic sensor 101 further includes a substrate 111 having a top surface 111a, and insulating layers 112, 113, 114, 115, 116, 117, 118, 119, and 120. The top surface 111a of the substrate 111 is parallel to the XY plane. The Z direction is also a direction perpendicular to the top surface 111a of the substrate 111. The insulating layer 112 is disposed on the substrate 111. In the present example embodiment, the plurality of lower coil elements 71 and the plurality of lower coil elements 81 are disposed on the insulating layer 112. The insulating layer 113 is disposed around the plurality of lower coil elements 71 and around the plurality of lower coil elements 81 on the insulating layer 112. The insulating layers 114, 115, and 116 are stacked in this order on the plurality of lower coil elements 71, the plurality of lower coil elements 81, and the insulating layer 113.

In the present example embodiment, the plurality of lower electrodes 61A, the plurality of lower electrodes 61B, and the plurality of lower electrodes 61C are disposed on the insulating layer 116. The insulating layer 117 is disposed around the plurality of lower electrodes 61A, around the plurality of lower electrodes 61B, and around the plurality of lower electrodes 61C on the insulating layer 116. The plurality of first MR elements 50A are disposed on the plurality of lower electrodes 61A. The plurality of second MR elements 50B are disposed on the plurality of lower electrodes 61B. The plurality of third MR elements 50C are disposed on the plurality of lower electrodes 61C.

The insulating layer 118 is disposed around the plurality of first MR elements 50A, around the plurality of second MR elements 50B, and around the plurality of third MR elements 50C on the plurality of lower electrodes 61A, the plurality of lower electrodes 61B, the plurality of lower electrodes 61C, and the insulating layer 117. The plurality of upper electrodes 62A are disposed on the plurality of first MR elements 50A and the insulating layer 118. The plurality of upper electrodes 62B are disposed on the plurality of second MR elements 50B and the insulating layer 118. The plurality of upper electrodes 62C are disposed on the plurality of third MR elements 50C and the insulating layer 118. The insulating layer 119 is disposed around the plurality of upper electrodes 62A, around the plurality of upper electrodes 62B, and around the plurality of upper electrodes 62C on the insulating layer 118.

The insulating layer 120 is disposed on the plurality of upper electrodes 62A, the plurality of upper electrodes 62B, the plurality of upper electrodes 62C, and the insulating layer 119. In the present example embodiment, the plurality of upper coil elements 72 and the plurality of upper coil elements 82 are disposed on the insulating layer 120. The magnetic sensor 101 may further include a not-shown insulating layer that covers the plurality of upper coil elements 72, the plurality of upper coil elements 82, and the insulating layer 120.

The magnetic sensor 101 includes a support member 130 that supports the plurality of MR elements 50. The support member 130 has at least one inclined surface inclined relative to the top surface 111a of the substrate 111. In particular, in the example embodiment, the support member 130 includes the insulating layers 114, 115, and 116. The support member 130 has a plurality of protruding surfaces 130c each protruding in a direction away from the top surface 111a of the substrate 111 (Z direction) and a flat surface 130d around the plurality of protruding surfaces 130c. The plurality of protruding surfaces 130c have the same shape and layout as those of the plurality of protruding surfaces 320c of the first example embodiment.

The plurality of protruding surfaces 130c each include a first inclined surface 130a and a second inclined surface 130b. The support member 130 thus includes a plurality of first inclined surfaces 130a and a plurality of second inclined surfaces 130b. The plurality of first inclined surfaces 130a have the same shape and layout as those of the plurality of first inclined surfaces 320a of the first example embodiment. The plurality of second inclined surfaces 130b have the same shape and layout as those of the plurality of second inclined surfaces 320b of the first example embodiment.

The magnetic sensor 101 includes a first portion where the plurality of first MR elements 50A are disposed and a second portion where the plurality of second MR elements 50B and the plurality of third MR elements 50C are disposed. The plurality of protruding surfaces 130c are substantially formed by parts of the insulating layer 115 belonging to the second portion. Specifically, the foregoing parts of the insulating layer 115 include a plurality of protrusions 115C each protruding in the Z direction. The plurality of protrusions 115C each extend in the direction parallel to the U direction and have a top surface having a shape corresponding to each of the protruding surfaces 130c. The plurality of protrusions 115C are arranged at predetermined intervals along the direction parallel to the V direction.

The insulating layer 115 further includes a flat portion 115D. The flat portion 115D has a substantially constant thickness (dimension in the Z direction). The flat surface 130d is substantially formed by the flat portion 115D of the insulating layer 115 belonging to the first portion of the magnetic sensor 101 and the flat portion 115D lying around the plurality of protrusions 115C in the second portion of the magnetic sensor 101.

The insulating layer 116 has a substantially constant thickness (dimension in the Z direction) and is formed along the top surface of the insulating layer 115. The top surface of the insulating layer 116 thus forms the plurality of protruding surfaces 130c and the flat surface 130d. The insulating layer 114 has a substantially constant thickness (dimension in the Z direction) and is formed along the bottom surface of the insulating layer 115.

In the example embodiment, the plurality of lower electrodes 61A are disposed on the flat surface 130d. The top surface 111a of the substrate 111 is parallel to the XY plane. The top surface of each of the plurality of lower electrodes 61A is also parallel to the XY plane.

In the example embodiment, the plurality of lower electrodes 61B are disposed on the plurality of first inclined surfaces 130a. The plurality of lower electrodes 61C are disposed on the plurality of second inclined surfaces 130b. Since the first inclined surfaces 130a and the second inclined surfaces 130b are both inclined relative to the top surface 111a of the substrate 111, i.e., the XY plane, the top surface of each of the plurality of lower electrodes 61B and the top surface of each of the plurality of lower electrodes 61C are also inclined relative to the XY plane.

The configuration, operation, and effects of the present example embodiment are otherwise the same as those of the first example embodiment.

Third Example Embodiment

Figure 15:
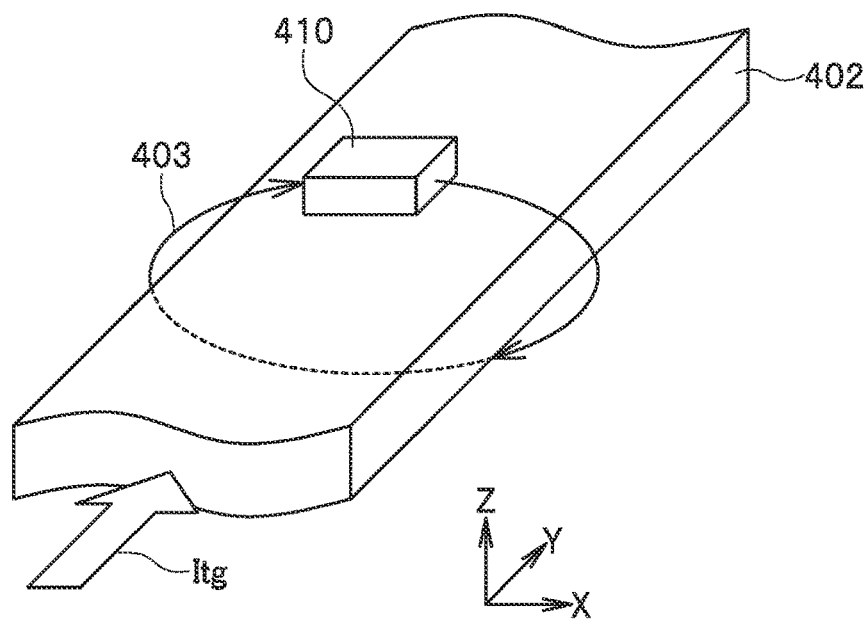
FIG. 15 is a perspective view showing a configuration of a current sensor system including a magnetic sensor according to a third example embodiment of the technology.

A third example embodiment of the technology will now be described. Initially, a configuration of a current sensor system including a magnetic sensor according to the example embodiment will be described with reference to FIG. 15. A magnetic sensor 410 according to the example embodiment is used as a current sensor for detecting the value of a current to be detected flowing through a conductor. The current to be detected corresponds to the "predetermined physical quantity" of the technology. FIG. 15 shows an example in which the conductor through which the current to be detected flows is a bus bar 402. The magnetic sensor 410 is disposed near the bus bar 402. Hereinafter, the current to be detected will be referred to as target current Itg. The target current Itg generates a magnetic field 403 around the bus bar 402. The magnetic sensor 410 is disposed at a position where the magnetic field 403 is applied.

Figure 16:
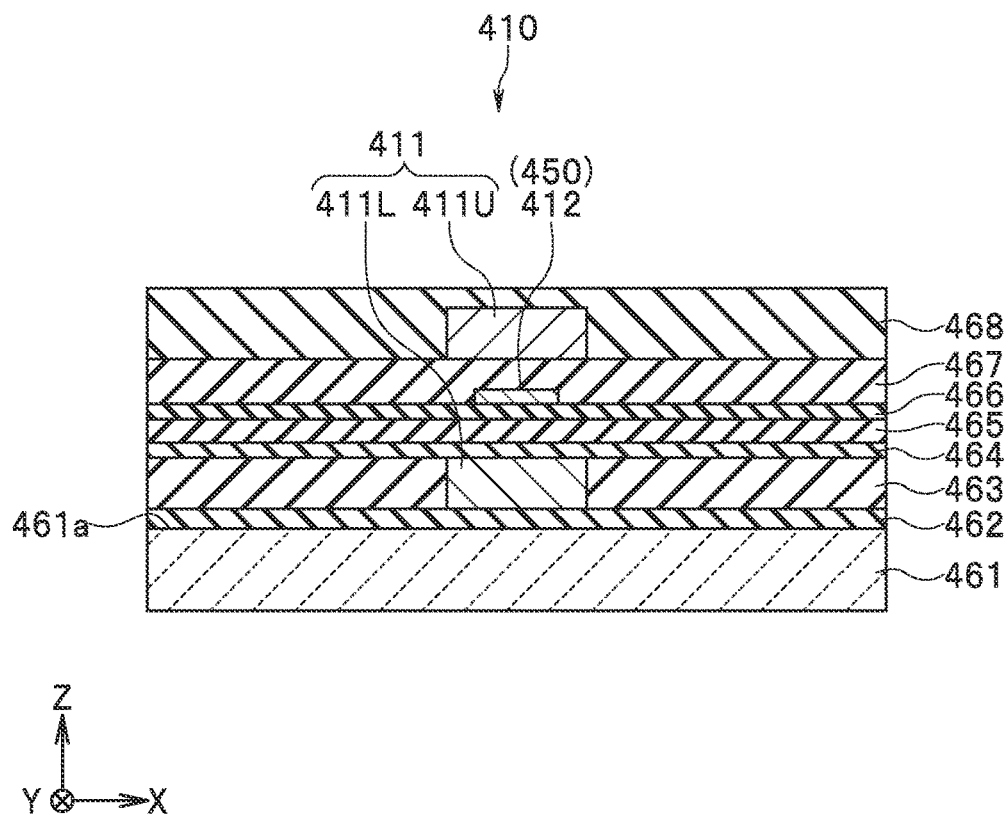
FIG. 16 is a sectional view of the magnetic sensor of the third example embodiment of the technology.

Next, a configuration of the magnetic sensor 410 according to the example embodiment will be described with reference to FIG. 16. FIG. 16 is a sectional view showing the magnetic sensor 410. The magnetic sensor 410 is a magnetic balance type current sensor. As shown in FIG. 16, the magnetic sensor 410 includes a coil 411, and a detection circuit 412 including the plurality of magnetic detection elements. The coil 411 and the detection circuit 412 are integrated with each other by a plurality of insulating layers, which will be described later. The magnetic sensor 410 is independent of the bus bar 402.

Here, an X direction, a Y direction, and a Z direction of the example embodiment will be defined as shown in FIGS. 15 and 16. In the present example embodiment, the target current Itg shown in FIG. 15 flows in the Y direction. For each component of the magnetic sensor 410, a surface located at the end in the Z direction will be referred to as a "top surface". A surface located at the end in the −Z direction will be referred to as a "bottom surface".

The magnetic sensor 410 is disposed above a bus bar 402 (on the Z direction side of the bus bar 402) or below the bus bar 402 (on the −Z direction side of the bus bar 402). The following shows an example in which the magnetic sensor 410 is disposed above the bus bar 402.

Figure 17:
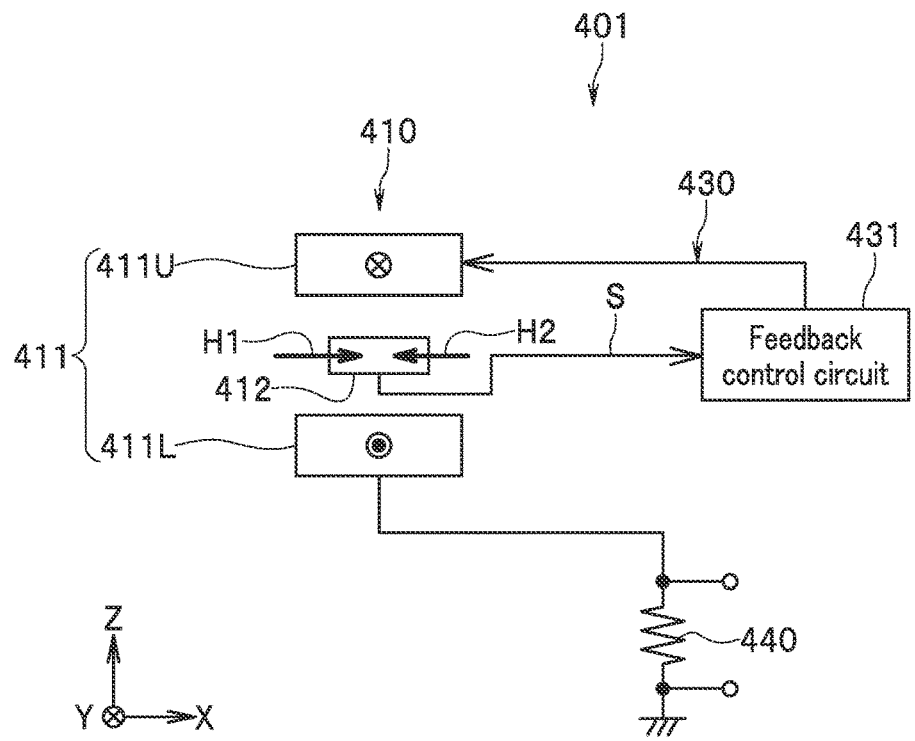
FIG. 17 is a block diagram showing a configuration of the magnetic sensor device including the magnetic sensor according to the third example embodiment of the technology.

A portion of the magnetic field 403 generated by the target current Itg, which is detectable by the detection circuit 412 will be referred to as the first magnetic field H1. The coil 411 is to generate a second magnetic field H2 that cancels out the first magnetic field H1. By using the plurality of magnetic detection elements, the detection circuit 412 detects a composite magnetic field of the first magnetic field H1 and the second magnetic field H2 as a target magnetic field that is a magnetic field to be detected. The detection circuit 412 generates a magnetic-field detection value S based on the strength of the target magnetic field. The first magnetic field H1 and the second magnetic field H2 are shown in FIG. 17 to be described later.

In the present example embodiment, the direction of each of the first and second magnetic fields H1 and H2 and the direction of the target magnetic field are parallel to the X direction. The configuration of the detection circuit 412 will be described in detail later.

As shown in FIG. 16, the magnetic sensor 410 further includes a substrate 461 having a top surface 461a, insulating layers 462, 463, 464, 465, 466, 467, and 468, a lower coil element 411L, and an upper coil element 411U. The insulating layer 462 is disposed on the substrate 461. The lower coil element 411L is disposed on the insulating layer 462. The insulating layer 463 is disposed around the lower coil element 411L on the insulating layer 462. The insulating layers 464, 465, and 466 are stacked in this order on the lower coil element 411L and the insulating layer 463.

The detection circuit 412 is disposed on the insulating layer 466. The insulating layer 467 is disposed to cover the detection circuit 412 and the insulating layer 466. The upper coil element 411U is disposed on the insulating layer 467. The insulating layer 468 is disposed to cover the upper coil element 411U and the insulating layer 467.

The magnetic sensor 410 may further include a not-shown magnetic layer. The magnetic layer has a function of absorbing a part of the magnetic flux generated by the target current Itg to make the absolute value of the first magnetic field H1 smaller than that in a configuration without the magnetic layer. The magnetic layer is located on the insulating layer 468, for example.

The lower coil element 411L and the upper coil element 411U are electrically connected to constitute the coil 411. The magnetic sensor 410 may include more than one lower coil element 411L and more than one upper coil element 411U.

Next, a circuit connected to the magnetic sensor 410 will be described with reference to FIG. 17. The magnetic sensor 410 and the circuit connected to the magnetic sensor 410 constitute a magnetic sensor device 401. FIG. 17 is a block diagram showing a configuration of the magnetic sensor device 401. As shown in FIG. 17, the magnetic sensor device 401 includes the magnetic sensor 410, a feedback circuit 430, and a current detector 440. The feedback circuit 430 controls, in accordance with the magnetic-field detection value S, a feedback current to be used to generate the second magnetic field H2, and passes the feedback current through the coil 411. The current detector 440 generates a detection value of the feedback current passed through the coil 411. The current detector 440 is, for example, a resistor inserted to a current path of the feedback current. A potential difference across the resistor corresponds to the detection value of the feedback current. The detection value of the feedback current generated by the current detector 440 will hereinafter be referred to as a current detection value. The current detection value is in proportion to the value of the target current Itg. The current detection value thus corresponds to the detection value of the target current Itg.

The feedback circuit 430 includes a feedback control circuit 431. The feedback control circuit 431 generates the feedback current controlled in accordance with the magnetic-field detection value S, and supplies it to the coil 411.

Next, the configuration of the detection circuit 412 will be described in detail. As described above, the detection circuit 412 includes a plurality of magnetic detection elements. The magnetic detection elements may be MR elements or Hall elements. The MR element may be a spin-valve MR element or an anisotropic magnetoresistive (AMR) element. In particular, in the present example embodiment, the detection circuit 412 includes a plurality of spin-valve MR elements 450 as the plurality of magnetic detection elements. The plurality of MR elements 450 each have the same configuration as that of the MR elements 450 described in the first example embodiment. The plurality of MR elements 450 each include a magnetization pinned layer 52, a gap layer 53, and a free layer 54 described in the first example embodiment. The plurality of MR elements 450 each may further include an antiferromagnetic layer 51 described in the first example embodiment.

Figure 18:
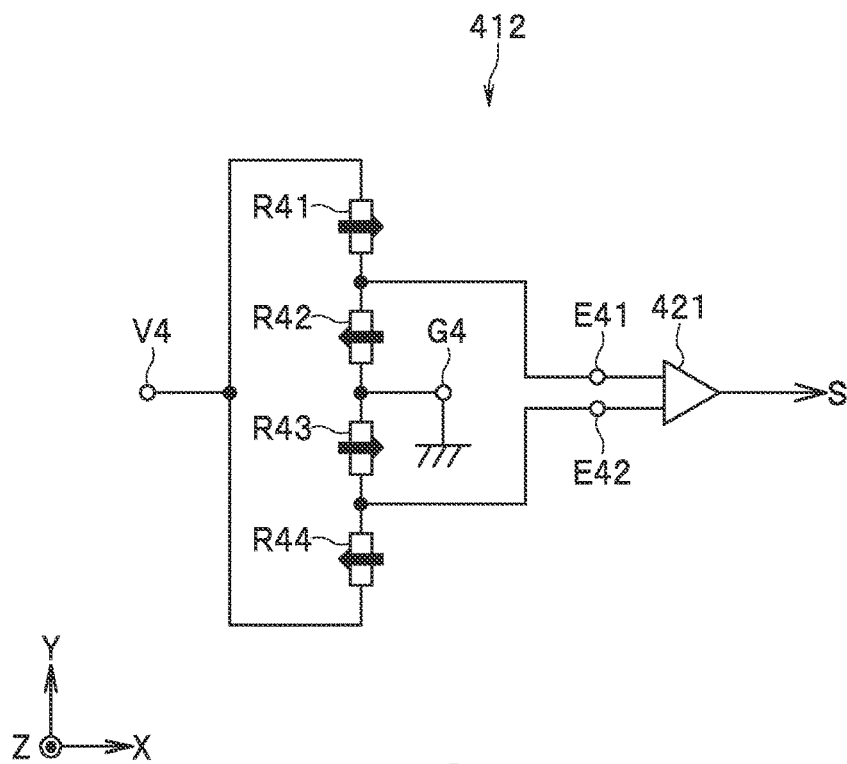
FIG. 18 is a circuit diagram showing a circuit configuration of a detection circuit of the third example embodiment of the technology.

FIG. 18 is a circuit diagram showing a circuit configuration of the detection circuit 412. The detection circuit 412 includes a power supply port V4, a ground port G4, two signal output ports E41 and E42, a differential detector 421, a first resistor section R41, a second resistor section R42, a third resistor section R43, and a fourth resistor section R44.

The first resistor section R41 is provided between the power supply port V4 and the signal output port E41. The second resistor section R42 is provided between the signal output port E41 and the ground port G4. The third resistor section R43 is provided between the signal output port E42 and the ground port G4. The fourth resistor section R44 is provided between the power supply port V4 and signal output port E42. A voltage or current of predetermined magnitude is applied to the power supply port V4. The ground port G4 is connected to the ground.

The first to fourth resistor sections R1 to R4 each include at least one MR element 450. The magnetization pinned layer 52 of the MR element 450 of each of the first and third resistor sections R41 and R43 has a first magnetization direction. The magnetization pinned layer 52 of the MR element 450 of each of the second and fourth resistor sections R42 and R44 has a second magnetization direction opposite to the first magnetization direction. Here, a direction parallel to the first and second magnetization directions will be referred to as a magnetosensitive direction. The free layer 54 of each MR element 450 preferably has a shape anisotropy whose easy axis is orthogonal to the magnetosensitive direction.

The magnetic field 403 generated by the target current Itg and a magnetic field generated by the coil 411 are applied to the detection circuit 412. The detection circuit 412 is positioned such that the directions of the aforementioned two magnetic fields to be applied thereto are opposite or substantially opposite to each other, and is oriented such that the magnetosensitive direction is parallel or substantially parallel to the directions of the aforementioned two magnetic fields.

In this example, the first magnetic field H1 is a component in the magnetosensitive direction of the magnetic field generated by the target current Itg and applied to the detection circuit 412. The second magnetic field H2 is a component in the magnetosensitive direction of the magnetic field generated by the coil 411 and applied to the detection circuit 412.

As described above, the direction of the first magnetic field H1 and the direction of the second magnetic field H2 are parallel to the X direction. In such a case, as shown in FIG. 18, the detection circuit 412 is located so that the first magnetization direction is the X direction and the second magnetization direction is the −X direction. In view of the manufacturing accuracy of the MR elements 450 and the alignment accuracy of the detection circuit 412, the first and second magnetization directions may be slightly deviate from the foregoing directions. The magnetization pinned layers 52 may be magnetized to include a magnetization component including the first or second magnetization direction as its main component.

In the detection circuit 412, a potential difference between the signal output ports E41 and E42 varies depending on the strength of the target magnetic field. The differential detector 421 outputs a magnetic-field detection value S corresponding to the potential difference between the signal output ports E41 and E42. The strength of the target magnetic field, the potential difference between the signal output ports E41 and E42, and the magnetic-field detection value S can be of positive or negative values depending on the magnitudes of the first magnetic field H1 and the second magnetic field H2 relative to each other.

Next, structural features of the magnetic sensor 410 will be described with reference to FIG. 16. The magnetic sensor 410 includes the insulating layers 464, 465, and 466 arranged in order along the Z direction, the lower coil element 411L that is a metal layer, and the MR elements 450 that are sensor elements.

Like the first MR elements 50A in the first example embodiment, each of the MR elements 450 includes at least a functional layer (magnetization pinned layer 52 and free layer 54). The functional layer is located on the opposite side of the insulating layer 466 from the insulating layer 465.

The lower coil element 411L is located on the opposite side of the insulating layer 464 from the insulating layer 465. The lower coil element 411L is a part of the coil 411. The lower coil element 411L is formed of Cu, Au, or Al, for example.

Like the insulating layers 204 and 206 of the first example embodiment, the insulating layers 464 and 466 each contain a first insulating material. Like the insulating layer 205 according to the first example embodiment, the insulating layer 465 contains a second insulating material. The second insulating material is different from the first insulating material. The insulating layers 464 and 466 are preferably formed of the same first insulating material.

The insulating layer 465 includes a flat portion having a constant dimension in the Z direction. The functional layer (magnetization pinned layer 52 and free layer 54) is disposed along the flat portion. The maximum dimension of the insulating layer 465 in the Z direction may be greater than that of the insulating layer 464 in the Z direction and that of the insulating layer 466 in the Z direction.

The insulating layers 464, 465, and 466 correspond to the insulating layers 204, 205, and 206 of the first example embodiment. The lower coil element 411L corresponds to the lower coil elements 71 of the first example embodiment. The MR elements 450 correspond to the first MR elements 50A according to the first example embodiment. According to this example embodiment, the insulating layers 464, 465, and 466 can be prevented from cracking, for the same reason as described in the first example embodiment.

The configuration, operation, and effects of the present example embodiment are otherwise the same as those of the first example embodiment.

The technology is not limited to the foregoing example embodiments, and various modifications may be made thereto. For example, the metal layer according to the technology is not limited to the lower coil elements, and may be any given wiring layer. The magnetic detection elements are not limited to the MR elements, and may be elements such as Hall elements, that detect a magnetic field, other than MR elements.

The second insulating material may be a spin-on-glass material or a resin material such as polyimide. In such a case, the insulating layer containing the second insulating material is elastically deformable, whereby the insulating layer can be prevented from cracking.

The sensor elements according to the technology are not limited to magnetic detection elements, and may be sensor elements configured to change in physical properties depending on a predetermined physical quantity. The predetermined physical quantity is not limited to a magnetic field. Examples of the predetermined physical quantity may include the quantity of a state of any physical phenomenon detectable by the sensor elements, such as an electric field, temperature, displacement, and force. The description of the foregoing example embodiments also applies to nonmagnetic sensors including sensor elements other than magnetic detection elements if the magnetic detection elements are replaced with the sensor elements. In such a case, the functional layers may be a portion that constitutes at least of a part of the sensor elements and changes in physical properties depending on the predetermined physical quantity. In such a case, the metal layer may be any given wiring layer.

As described above, the sensor according to one embodiment of the technology is a sensor configured to detect a predetermined physical quantity. The sensor includes a first insulating layer, a second insulating layer, and a third insulating layer arranged in order along a first direction, a metal layer located on the opposite side of the first insulating layer from the second insulating layer, and a sensor element configured to change in physical properties depending on the predetermined physical quantity. The sensor element includes a functional layer constituting at least a part of the sensor element. The functional layer is located on the opposite side of the third insulating layer from the second insulating layer. The first and third insulating layers each contain a first insulating material. The second insulating layer contains a second insulating material.

In the sensor according to one embodiment of the technology, the second insulating layer may include a first portion and a second portion located at a position different from the first portion in a second direction orthogonal to the first direction. The maximum dimension of the second portion in the first direction may be greater than that of the first portion in the first direction. The second portion may include an inclined surface inclined relative to the first direction. The functional layer may be disposed along the inclined surface. The metal layer may extend to intersect a border between the first and second portions when seen in the first direction.

In the sensor according to one embodiment of the technology, the second insulating layer may include a flat portion having a constant dimension in the first direction. The functional layer may be disposed along the flat portion.

In the sensor according to one embodiment of the technology, the second insulating material may have a fracture toughness value higher than that of the metal layer. The second insulating material may be $SiO_2$.

In the sensor according to one embodiment of the technology, the second insulating material may be a resin material.

In the sensor according to one embodiment of the technology, the first insulating material may have a fracture toughness value higher than that of the second insulating material. In such a case, the first insulating material may be $Al_2O_3$. The second insulating material may be $SiO_2$.

In the sensor according to one embodiment of the technology, the maximum dimension of the second insulating layer in the first direction may be greater than that of the first insulating layer in the first direction and that of the third insulating layer in the first direction.

In the sensor according to one embodiment of the technology, the predetermined physical quantity may be at least either a direction or a strength of a target magnetic field that is a magnetic field to be detected. The sensor element may be a magnetic detection element configured to detect a change in at least either the direction or the strength of the target magnetic field. The magnetic detection element may be a magnetoresistive element. The functional layer may include a plurality of magnetic films.

In the sensor according to one embodiment of the technology, the metal layer may be a part of a coil. The predetermined physical quantity may be a current flowing through a conductor. The coil may be configured to generate a second magnetic field for cancelling a first magnetic field caused by the current. The sensor element may be a magnetic detection element configured to detect a composite magnetic field of the first and second magnetic fields.

Obviously, various modification examples and variations of the technology are possible in the light of the above teachings. Thus, it is to be understood that, within the scope of the appended claims and equivalents thereof, the technology may be practiced in other embodiments than the foregoing example embodiments.

What is claimed is:

1. A sensor configured to detect a predetermined physical quantity, the sensor comprising:
   a first insulating layer, a second insulating layer, and a third insulating layer arranged in order along a first direction;
   a metal layer located on an opposite side of the first insulating layer from the second insulating layer; and
   a sensor element configured to change in a physical property depending on the predetermined physical quantity, wherein:
   the sensor element includes a functional layer constituting at least a part of the sensor element;
   the functional layer is located on an opposite side of the third insulating layer from the second insulating layer;
   the first and third insulating layers each contain a first insulating material;
   the second insulating layer contains a second insulating material;

the second insulating layer includes a first portion and a second portion located at a position different from the first portion in a second direction orthogonal to the first direction; and a maximum dimension of the second portion in the first direction is greater than a maximum dimension of the first portion in the first direction.

2. The sensor according to claim 1, wherein the metal layer extends to intersect a border between the first and second portions when seen in the first direction.

3. The sensor according to claim 1, wherein the second insulating material is a resin material.

4. The sensor according to claim 1, wherein a maximum dimension of the second insulating layer in the first direction is greater than a maximum dimension of the first insulating layer in the first direction and that of the third insulating layer in the first direction.

5. The sensor according to claim 1, wherein the second portion has an inclined surface inclined relative to the first direction.

6. The sensor according to claim 5, wherein the functional layer is disposed along the inclined surface.

7. The sensor according to claim 1, wherein the second insulating layer includes a flat portion having a constant dimension in the first direction.

8. The sensor according to claim 7, wherein the functional layer is disposed along the flat portion.

9. The sensor according to claim 1, wherein the second insulating material has a fracture toughness value higher than a fracture toughness of the metal layer.

10. The sensor according to claim 9, wherein the second insulating material is $SiO_2$.

11. The sensor according to claim 1, wherein the first insulating material has a fracture toughness value higher than a fracture toughness of the second insulating material.

12. The sensor according to claim 11, wherein:
the first insulating material is $Al_2O_3$; and
the second insulating material is $SiO_2$.

13. The sensor according to claim 1, wherein:
the predetermined physical quantity is at least either a direction or a strength of a target magnetic field that is a magnetic field to be detected; and the sensor element is a magnetic detection element configured to detect a change in at least either the direction or the strength of the target magnetic field.

14. The sensor according to claim 13, wherein:
the magnetic detection element is a magnetoresistive element; and
the functional layer includes a plurality of magnetic films.

15. The sensor according to claim 1, wherein the metal layer is a part of a coil.

16. The sensor according to claim 15, wherein:
the predetermined physical quantity is a current flowing through a conductor;
the coil is configured to generate a second magnetic field for cancelling a first magnetic field caused by the current; and
the sensor element is a magnetic detection element configured to detect a composite magnetic field of the first and second magnetic fields.

17. A sensor configured to detect a predetermined physical quantity, the sensor comprising:
a first insulating layer, a second insulating layer, and a third insulating layer arranged in order along a first direction;
a metal layer located on an opposite side of the first insulating layer from the second insulating layer; and
a sensor element configured to change in a physical property depending on the predetermined physical quantity, wherein:
the sensor element includes a functional layer constituting at least a part of the sensor element;
the functional layer is located on an opposite side of the third insulating layer from the second insulating layer;
the first and third insulating layers each contain a first insulating material;
the second insulating layer contains a second insulating material; and
a maximum dimension of the second insulating layer in the first direction is greater than a maximum dimension of the first insulating layer in the first direction and that of the third insulating layer in the first direction.

* * * * *